US012394481B2

(12) United States Patent
Clampitt et al.

(10) Patent No.: US 12,394,481 B2
(45) Date of Patent: Aug. 19, 2025

(54) ELECTRONIC DEVICES INCLUDING SUPPORT PILLARS IN SLOT REGIONS, AND RELATED MEMORY DEVICES, SYSTEMS, AND METHODS

(71) Applicant: Micron Technology, Inc., Boise, ID (US)

(72) Inventors: Darwin A. Clampitt, Wilder, ID (US); John D. Hopkins, Meridian, ID (US); Roger W. Lindsay, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 620 days.

(21) Appl. No.: 17/668,304

(22) Filed: Feb. 9, 2022

(65) Prior Publication Data
US 2023/0253043 A1    Aug. 10, 2023

(51) Int. Cl.
| | |
|---|---|
| *G11C 16/04* | (2006.01) |
| *H10B 41/10* | (2023.01) |
| *H10B 41/27* | (2023.01) |
| *H10B 41/35* | (2023.01) |
| *H10B 43/10* | (2023.01) |
| *H10B 43/27* | (2023.01) |
| *H10B 43/35* | (2023.01) |

(52) U.S. Cl.
CPC ......... *G11C 16/0483* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02); *H01L 2225/06541* (2013.01)

(58) Field of Classification Search
CPC .............. H10B 20/40–65; H10B 53/20; H10B 41/20–27; H10B 43/20–27; H10B 51/20; H10B 63/84–845; H01L 2225/06541
See application file for complete search history.

(56) References Cited

U.S. PATENT DOCUMENTS

| | | | |
|---|---|---|---|
| 8,546,239 B2 * | 10/2013 | Harari | H10B 41/30 438/421 |
| 9,401,371 B1 | 7/2016 | Lee et al. | |
| 9,449,984 B2 | 9/2016 | Alsmeier et al. | |
| 9,960,045 B1 | 5/2018 | Purayath et al. | |
| 10,256,247 B1 | 4/2019 | Kanakamedala et al. | |
| 10,290,648 B1 | 5/2019 | Zhou et al. | |
| 10,734,396 B2 | 8/2020 | Kang | |

(Continued)

OTHER PUBLICATIONS

U.S. Appl. No. 17/063,101, filed Oct. 5, 2020, titled "Microelectronic Devices With Support Pillars Spaced Along a Slit Region Between Pillar Array Blocks, and Related Methods and Systems", to Chandolu et al., 65 pages.

*Primary Examiner* — Amar Movva
(74) *Attorney, Agent, or Firm* — TraskBritt

(57) ABSTRACT

An electronic device comprises a stack comprising tiers of alternating conductive levels and insulative levels overlying a source, slots extending vertically through the stack and dividing the stack into blocks, and support pillars within the slots and extending vertically through the stack. The support pillars exhibit a lateral dimension in a first horizontal direction relatively larger than a lateral dimension of the slots in the first horizontal direction, substantially orthogonal to a second horizontal direction in which the slots extend. Related memory devices, systems, and methods are also described.

19 Claims, 11 Drawing Sheets

(56) References Cited

U.S. PATENT DOCUMENTS

| | | |
|---|---|---|
| 11,094,627 B2 | 8/2021 | Machkaoutsan et al. |
| 11,101,210 B2 | 8/2021 | Hu et al. |
| 2013/0009236 A1 | 1/2013 | Lee et al. |
| 2014/0361360 A1* | 12/2014 | Alsmeier ............ H01L 29/7926 257/324 |
| 2015/0340377 A1 | 11/2015 | Lee |
| 2016/0268283 A1 | 9/2016 | Kitamura et al. |
| 2017/0148805 A1 | 5/2017 | Nishikawa et al. |
| 2020/0194373 A1 | 6/2020 | Baek et al. |
| 2020/0295031 A1 | 9/2020 | Lue |
| 2020/0312416 A1 | 10/2020 | Harari |
| 2020/0312863 A1* | 10/2020 | Iwai ...................... H10B 43/10 |
| 2021/0050361 A1 | 2/2021 | Hopkins et al. |
| 2021/0118899 A1 | 4/2021 | King |
| 2021/0249433 A1 | 8/2021 | Shamanna et al. |

* cited by examiner

ELECTRONIC DEVICES INCLUDING SUPPORT PILLARS IN SLOT REGIONS, AND RELATED MEMORY DEVICES, SYSTEMS, AND METHODS

TECHNICAL FIELD

Embodiments disclosed herein relate to the field of electronic device design and fabrication. More particularly, embodiments of the disclosure relate to electronic devices including pillars (e.g., memory cell pillars) within pillar array regions and support pillars within slot regions between pillar array blocks, and to related memory devices, systems, and methods of forming the electronic devices.

BACKGROUND

A continuing goal of the electronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more stack structures including tiers of conductive structures and insulative structures. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the stack structure(s) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the conductive structures of the stack structure(s) of the memory device. The staircase structure includes individual "steps" defining contact regions of the conductive structures, upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the height of the stacks increases to facilitate additional memory cells in the vertical memory arrays, the stacks may be prone to toppling or collapse during subsequently-conducted processing acts. For example, during replacement gate processing acts, the stacks may be subject to tier collapse during or after removal of portions of the tiers to be replaced with the conductive structures. Collapse of the portions of the stacks may reduce reliability of the vertical memory strings.

DETAILED DESCRIPTION

Figure 1A:
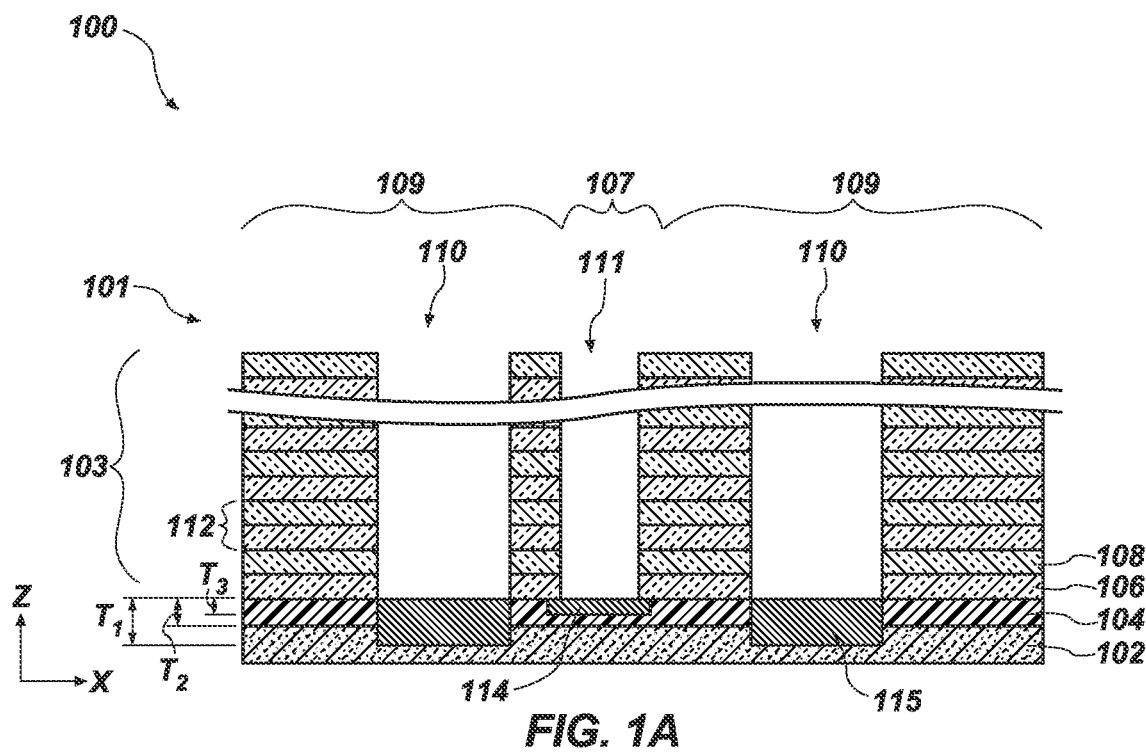
FIGS. 1A through 1P are simplified partial cross-sectional (FIGS. 1A, 1C-1E, 1G-1I, 1K-1N, and 1P) and simplified partial top-down (FIGS. 1, 1F, 1J, and 1O) views illustrating a method of forming an electronic device, in accordance with embodiments of the disclosure, where the top-down views of FIGS. 1B, 1F, 1J, and 1O are taken along the A-A line, the E-E line, the I-I line, and the N-N line in FIGS. 1A, 1E, 1I, and 1N, respectively.

An electronic device (e.g., an apparatus, a semiconductor device, a memory device) that includes support pillars (e.g., active support pillars) within slot regions between pillar array blocks is disclosed. The electronic device comprises a stack comprising tiers of alternating conductive levels (e.g., conductive structures) and insulative levels (e.g., insulative structures) overlying a source. Slots, which may also be referred to as "slits" or "replacement gate slots" extend vertically through the stack and divide the stack into blocks. The support pillars are located within the slots and extend vertically through the stack. The support pillars exhibit a lateral dimension (e.g., a width) in a first horizontal direction that is relatively larger than a lateral dimension of the slots in the first horizontal direction, substantially orthogonal to a second horizontal direction in which the slots extend. The electronic device may include a barrier material (e.g., a carbon-containing material) within the slots and laterally separating the support pillars from one another. A single line of the support pillars extends in the second horizontal direction within the slots. For example, the barrier material may be formed within the slots prior to conducting replacement gate processing acts, which processing acts may be conducted through support pillar openings in the barrier material. Portions of the barrier material may remain within the slots during such processing acts to provide structural support to the stack during formation of conductive structures of the conductive levels. In some embodiments, the insulative levels of the stack include one or more air gaps vertically separating the conductive structures from one another.

The support pillars, in combination with the barrier material, within the slots may provide increased structural support at locations horizontally proximate to the horizontal ends (e.g., horizontal boundaries) of large cantilever structures of the insulative structures of the tiers during the formation of the conductive structures. The support pillars and the barrier material may also provide structural support to the conductive structures to facilitate formation of the air gaps. By providing the portions of the barrier material that remain within the slots during formation of the conductive structures and the air gaps, such configurations may, for example, reduce or substantially prevent undesirable tier deformations (e.g., tier warping) and/or tier collapse during the formation of the conductive structures and the air gaps. Such a configuration may reduce or substantially prevent the risk of undesirable current leakage and short circuits during use and operation of the electronic device without significantly affecting conductivity.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional electronic device fabrication techniques employed in the industry. In addition, the description provided below does not form a complete process flow for manufacturing an electronic device (e.g., a memory device, such as 3D NAND Flash memory device). The structures described below do not form a complete electronic device. Only those process acts and structures necessary to understand the embodiments of the disclosure are described in detail below. Additional acts to form a complete electronic device from the structures may be performed by conventional fabrication techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, the term "configured" refers to a size, shape, material composition, and arrangement of one or more of at least one structure and at least one apparatus facilitating operation of one or more of the structure and the apparatus in a pre-determined way.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Stated another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), an electronic device combining logic and memory, or a graphics processing unit (GPU) incorporating memory.

As used herein, the term "electronic device" includes, without limitation, a memory device, as well as a semiconductor device which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "conductive material" means and includes an electrically conductive material. The conductive material may include one or more of a doped polysilicon, undoped polysilicon, a metal, an alloy, a conductive metal oxide, a conductive metal nitride, a conductive metal silicide, and a conductively doped semiconductor material. By way of example only, the conductive material may be one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), n-doped polysilicon, p-doped polysilicon, undoped polysilicon, and conductively doped silicon.

As used herein, a "conductive structure" means and includes a structure formed of and including one or more conductive materials.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions.

As used herein, an "insulative structure" means and includes a structure formed of and including one or more insulative materials.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "sacrificial," when used in reference to a material or structure, means and includes a material or structure that is formed during a fabrication process but which is removed (e.g., substantially removed) prior to completion of the fabrication process.

As used herein, the term "air gap" means a volume extending into or through another region or material, or between regions or materials, leaving a void in that other region or material, or between regions or materials, that is empty of a solid and/or liquid material. An air gap is not necessarily empty of a gaseous material (e.g., air, oxygen, nitrogen, argon, helium, or a combination thereof) and does not necessarily contain air. An air gap may be, but is not necessarily, a void (e.g., an unfilled volume, a vacuum).

Figure 1B:
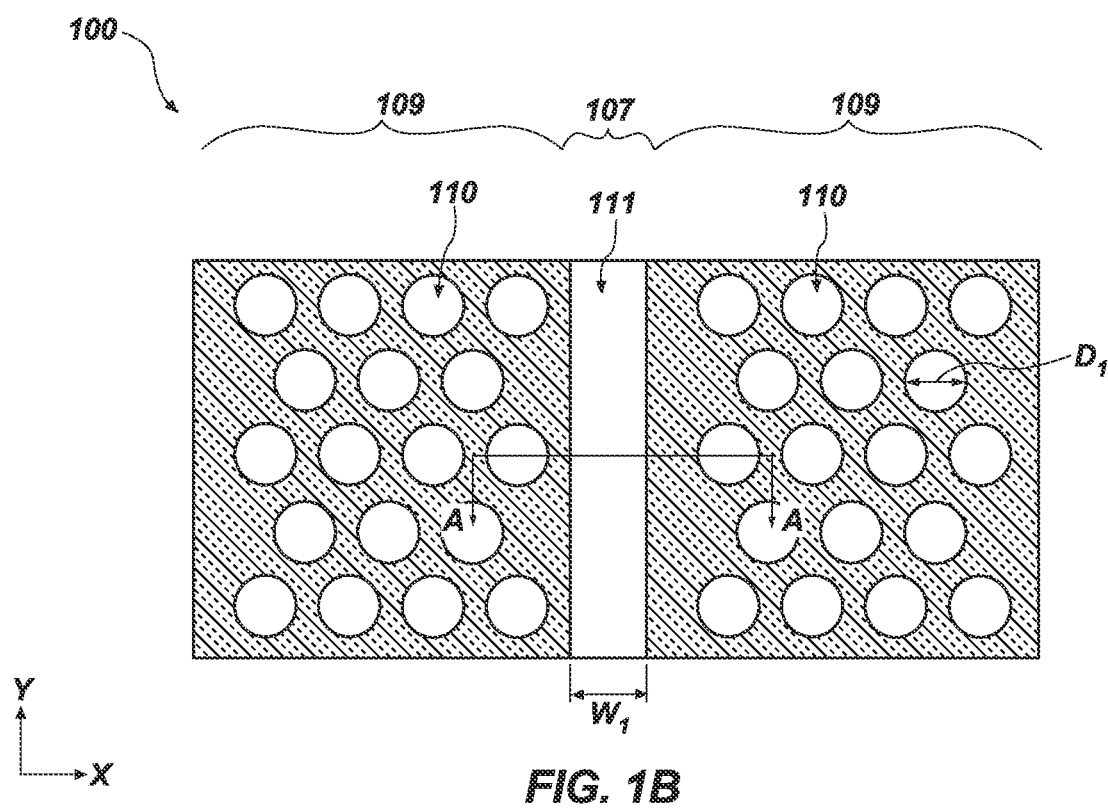
Figure 1C:
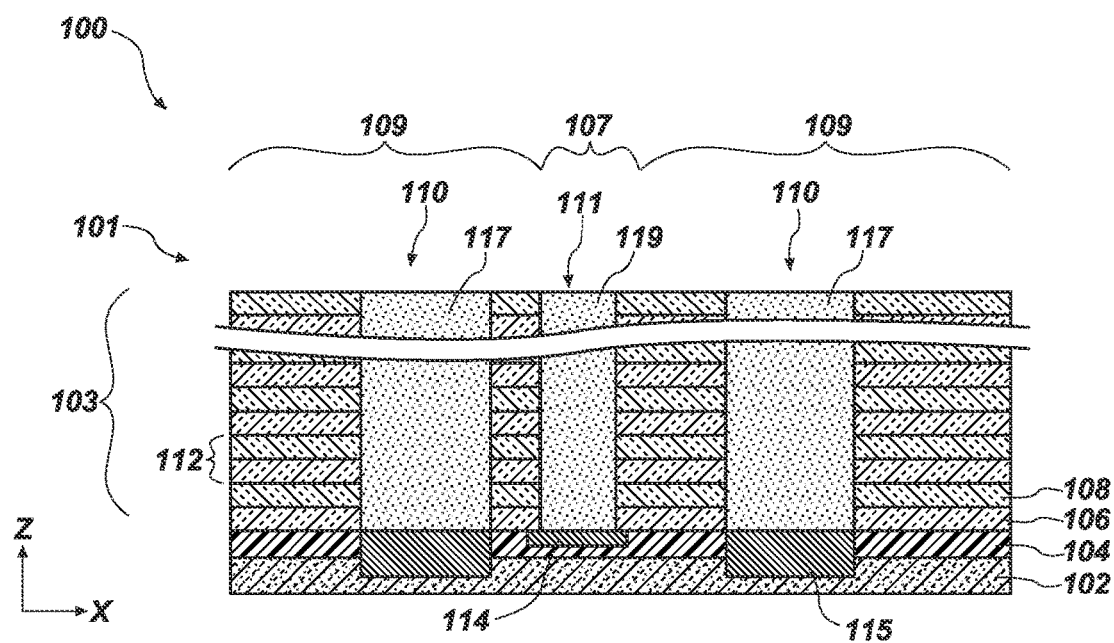
Figure 1D:
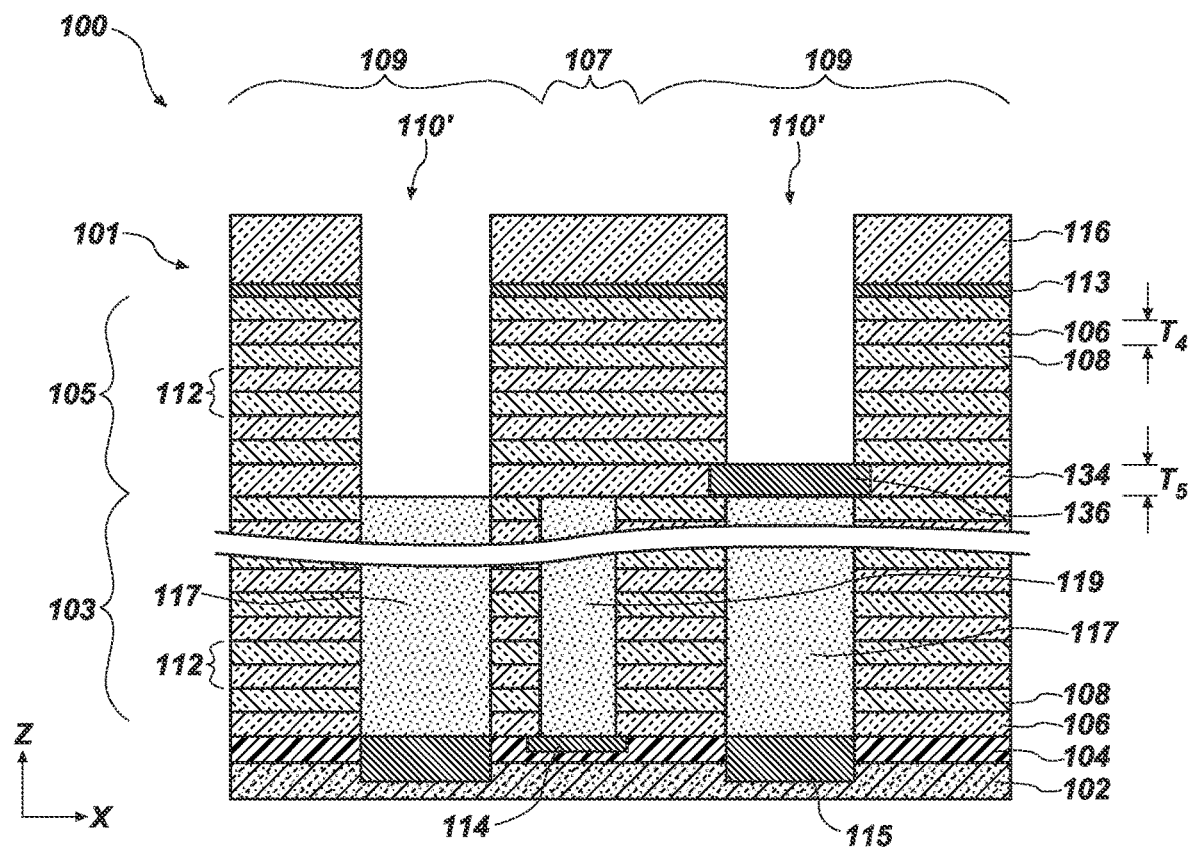
Figure 1E:
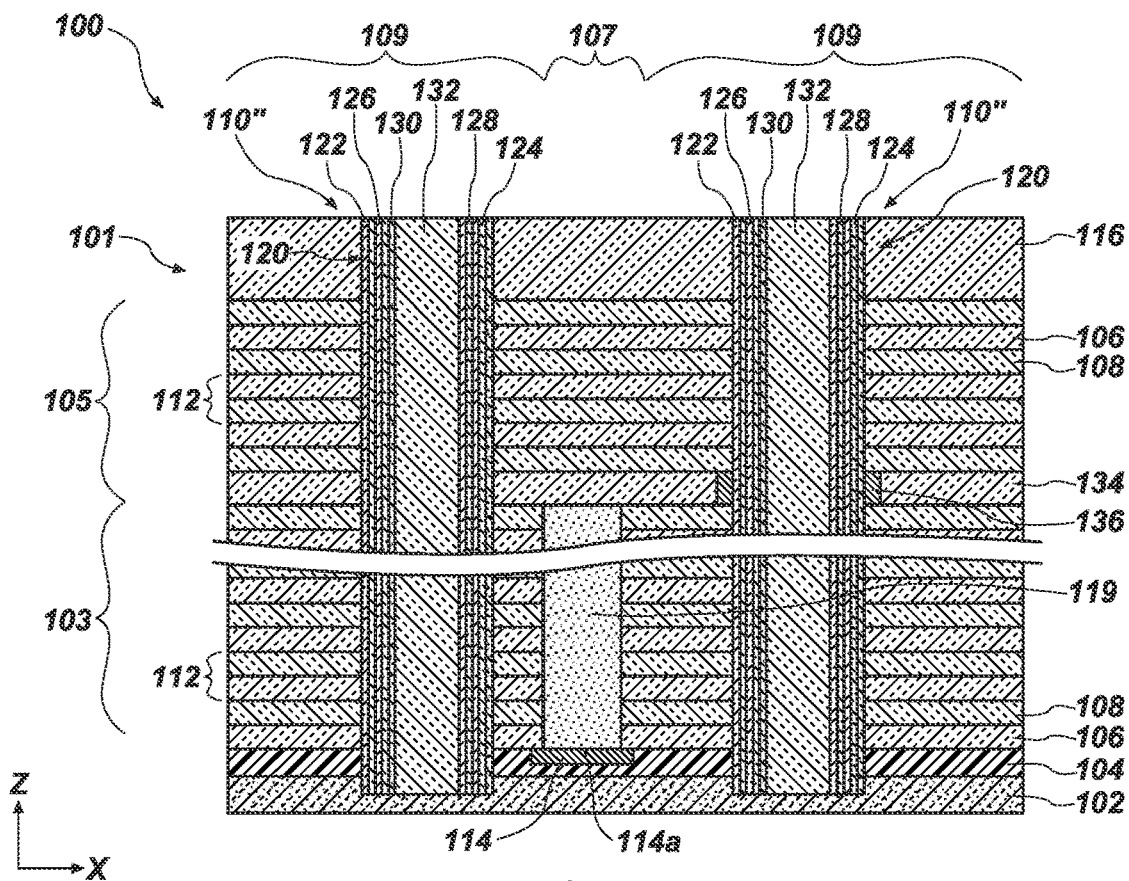
Figure 1F:
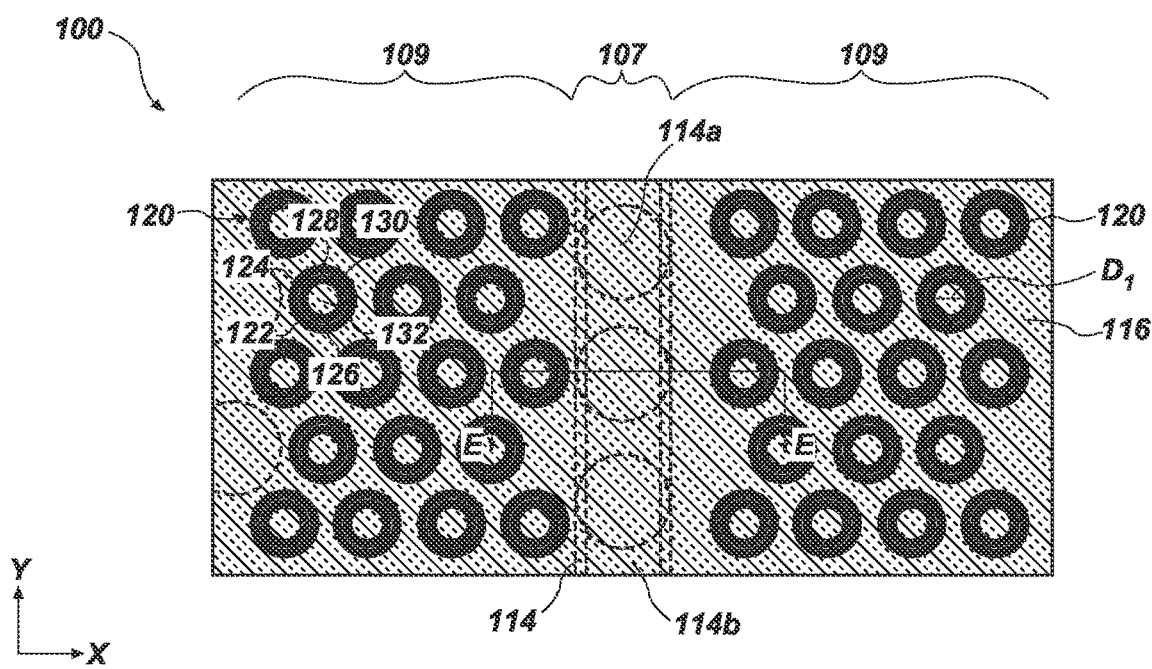
Figure 1G:
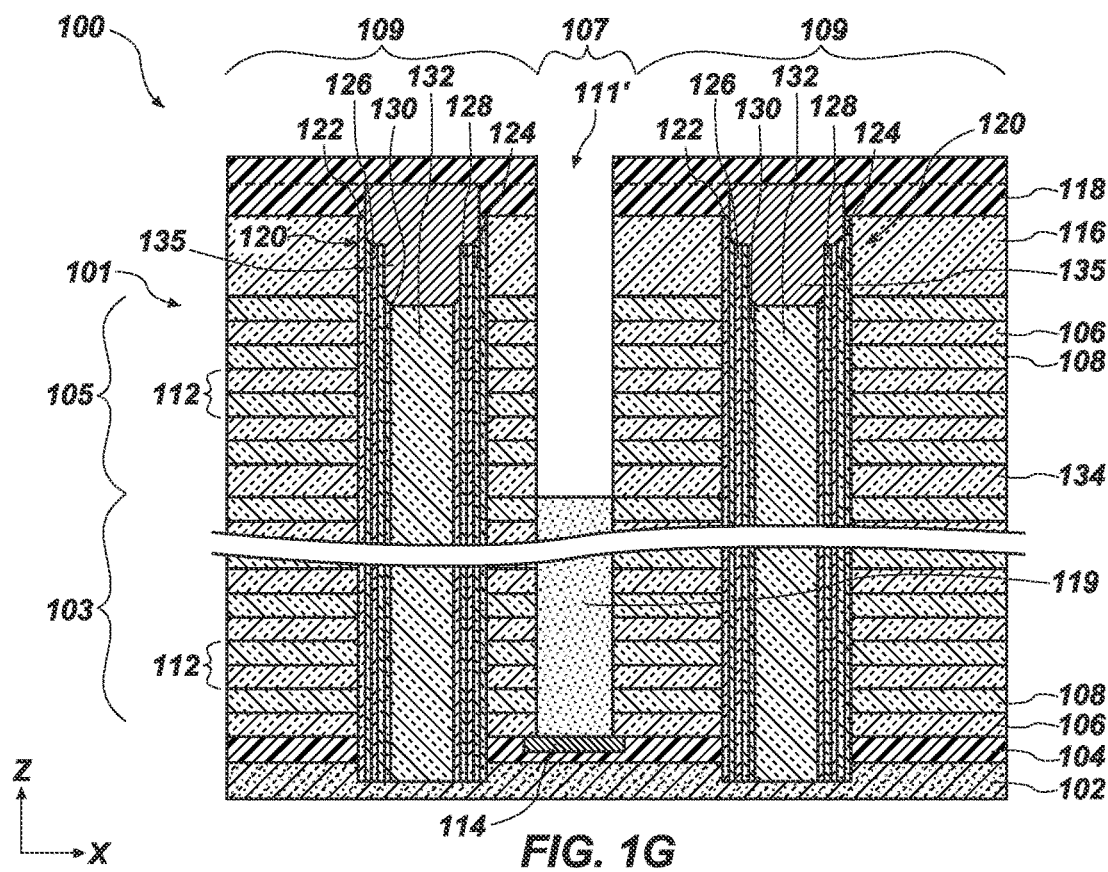
Figure 1H:
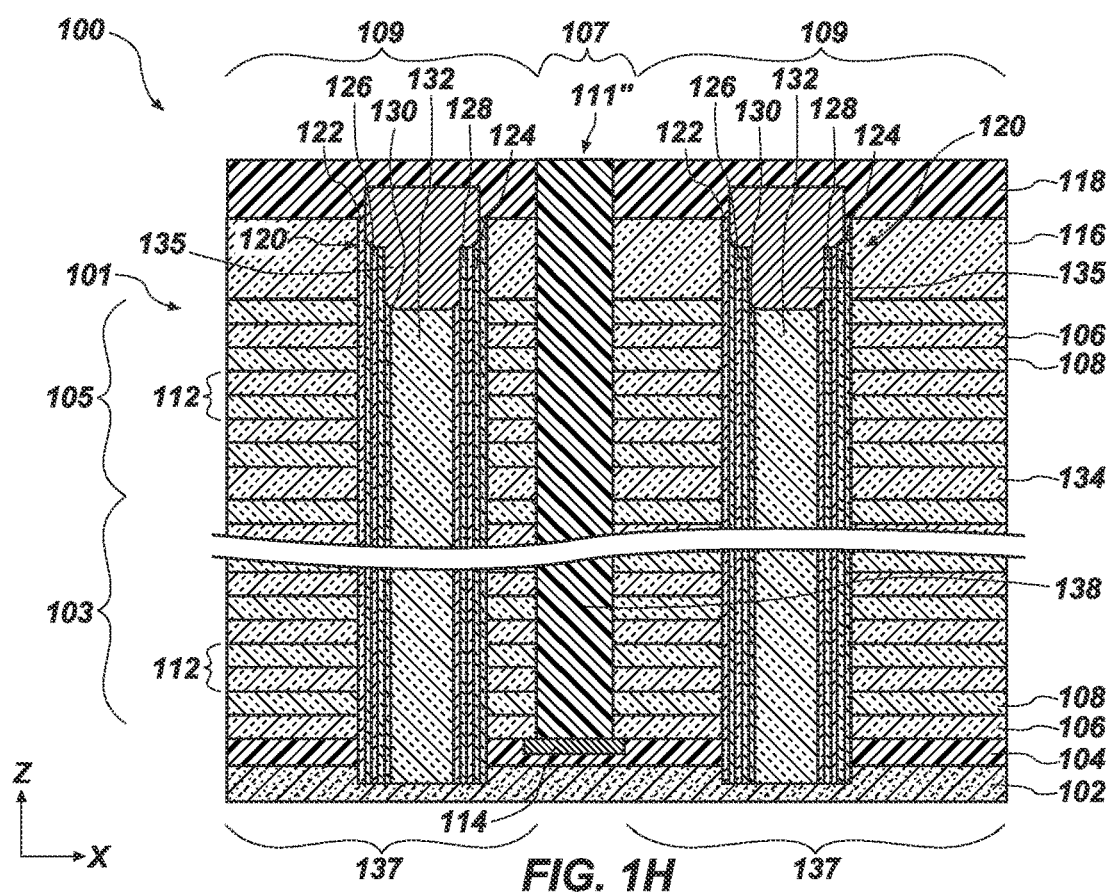
Figure 1I:
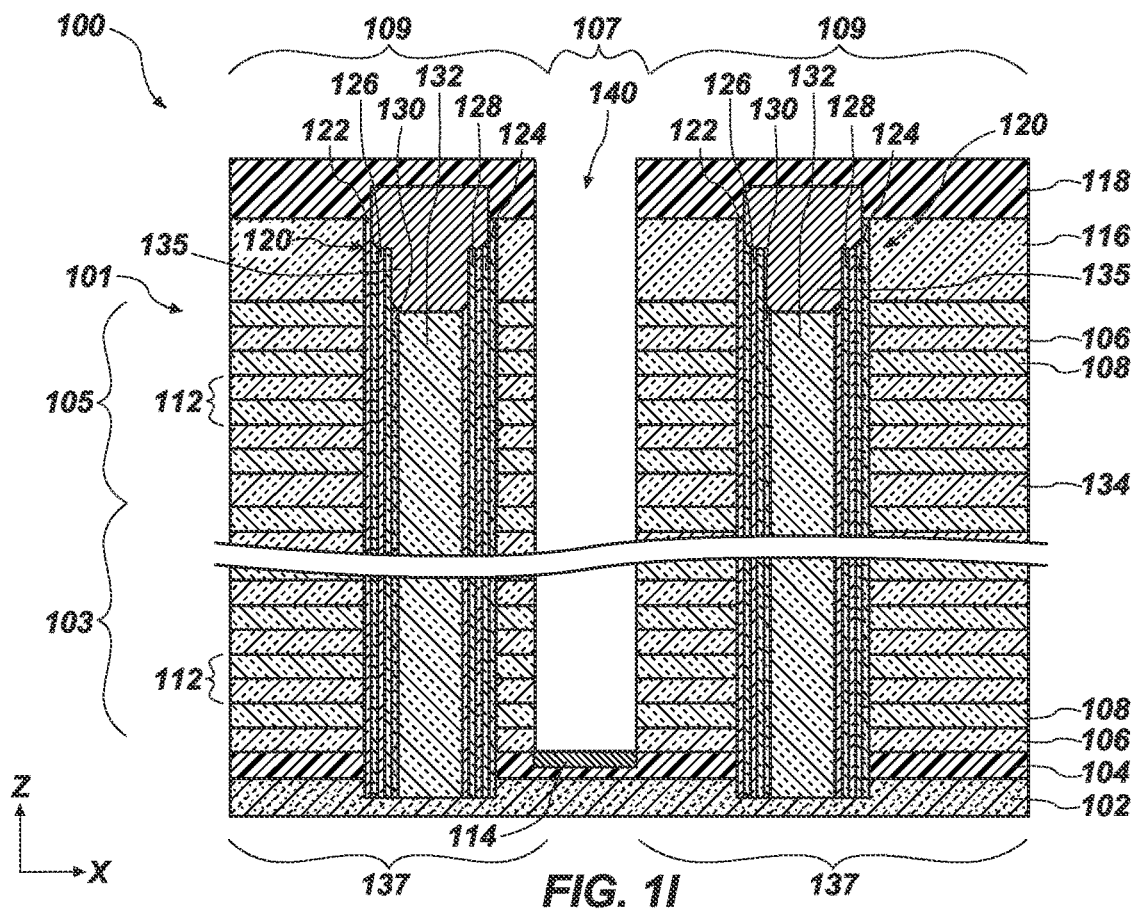
Figure 1J:
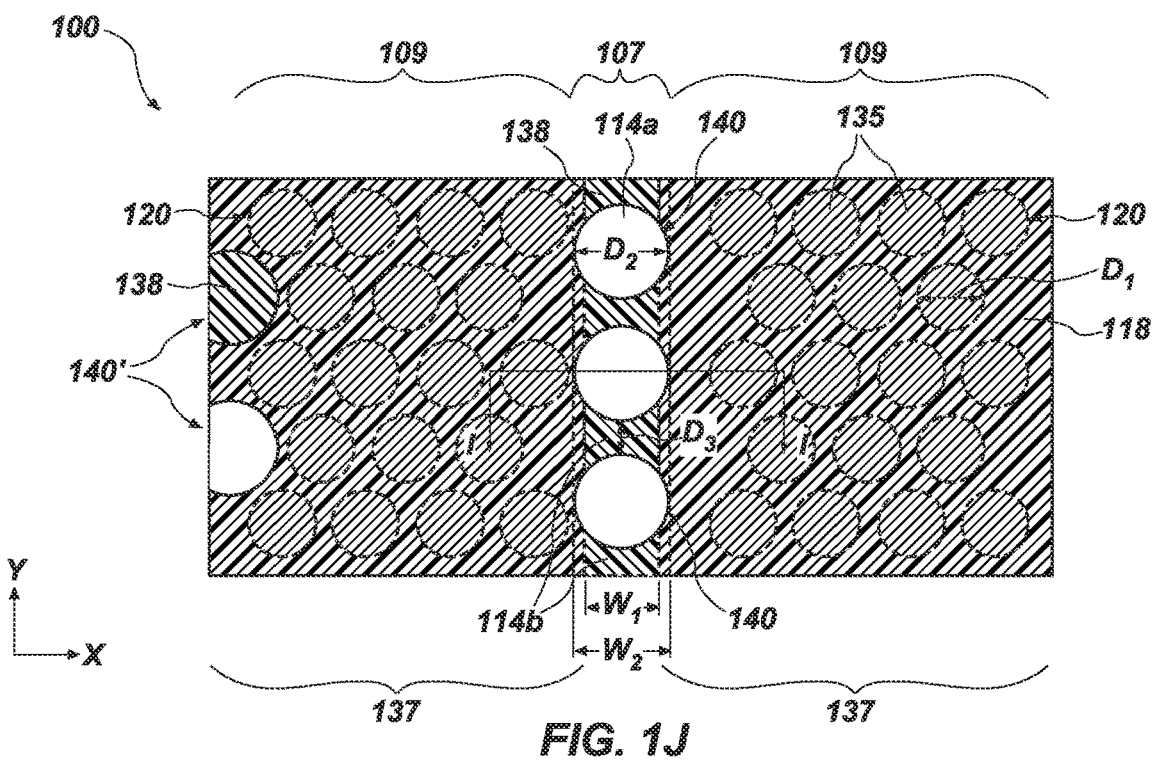
Figure 1K:
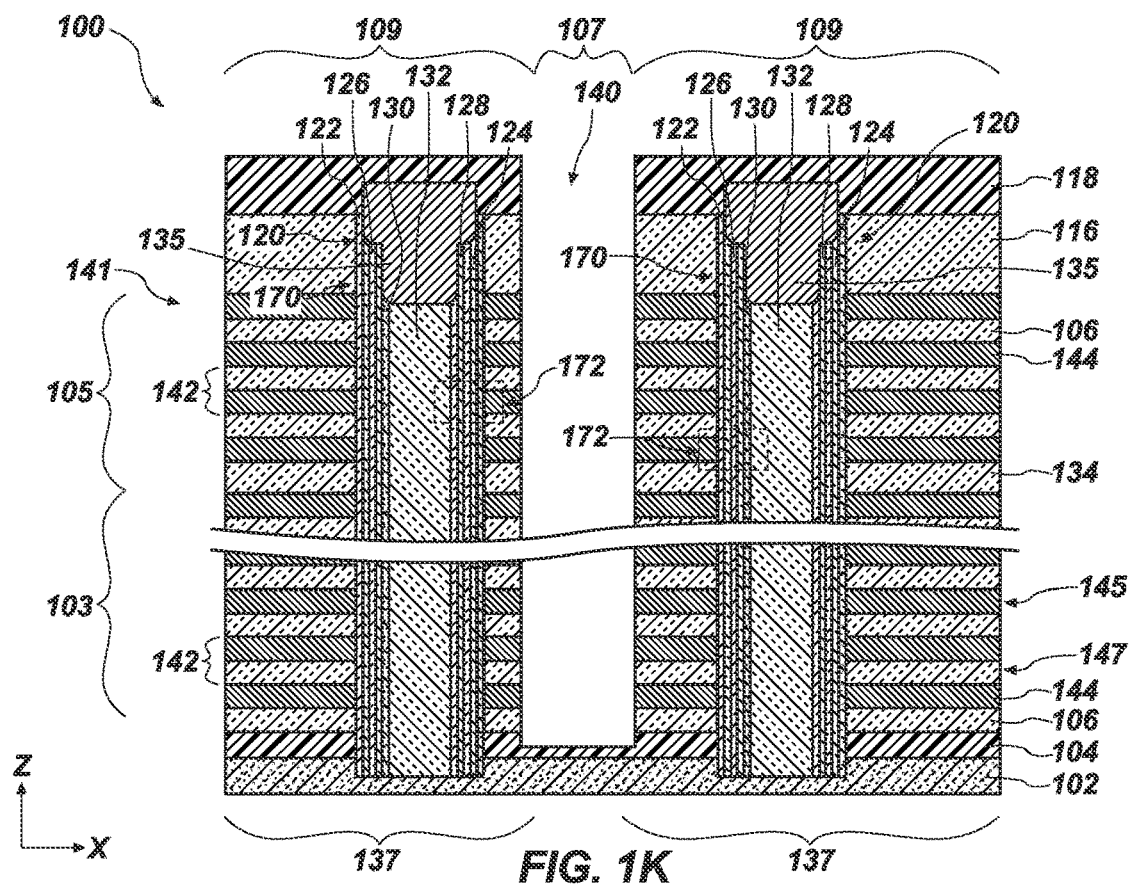
Figure 1L:
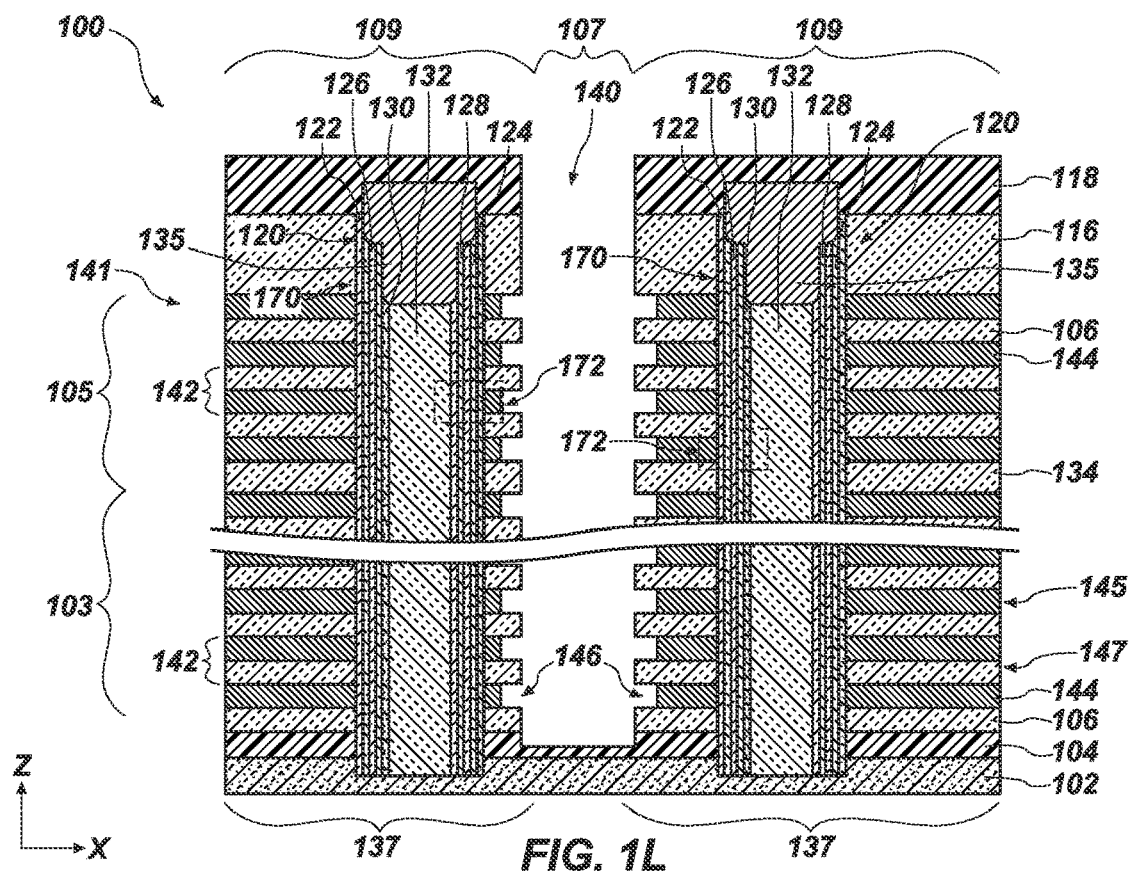
Figure 1M:
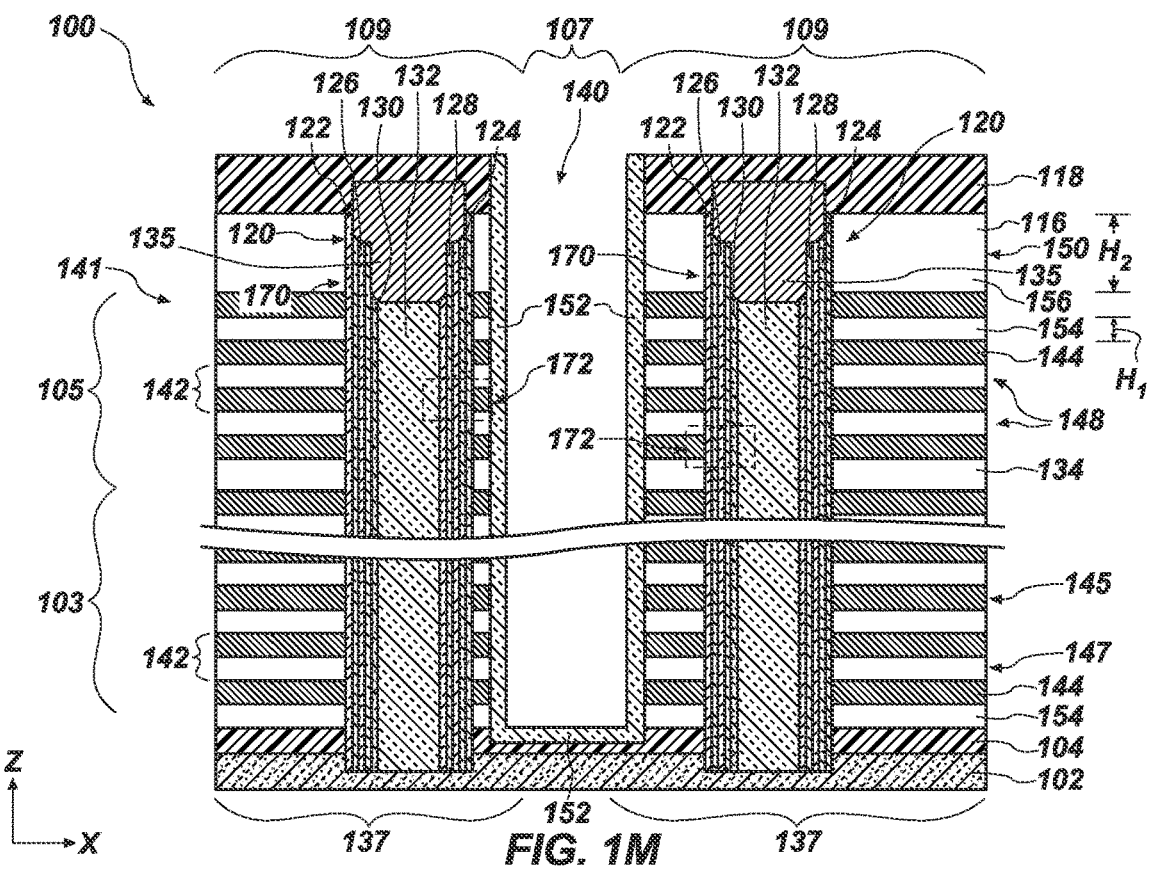
Figure 1N:
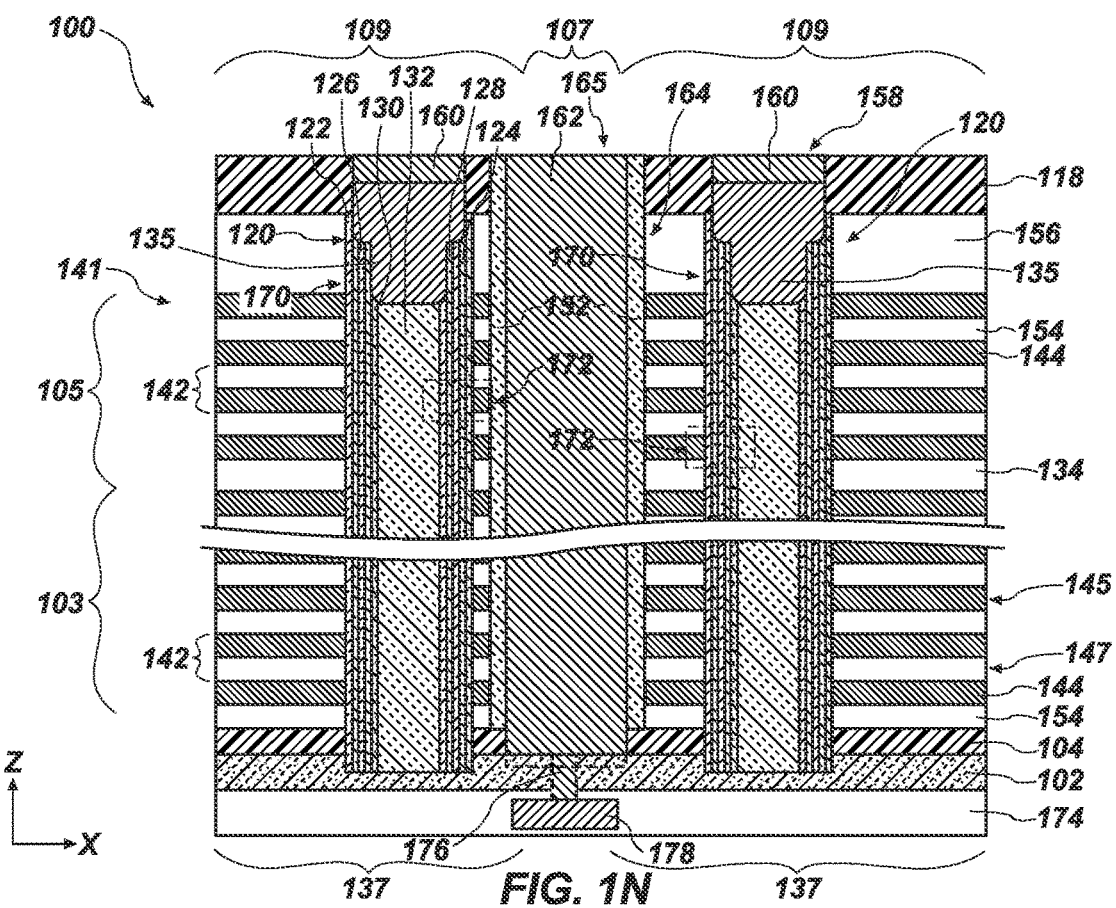
Figure 1O:
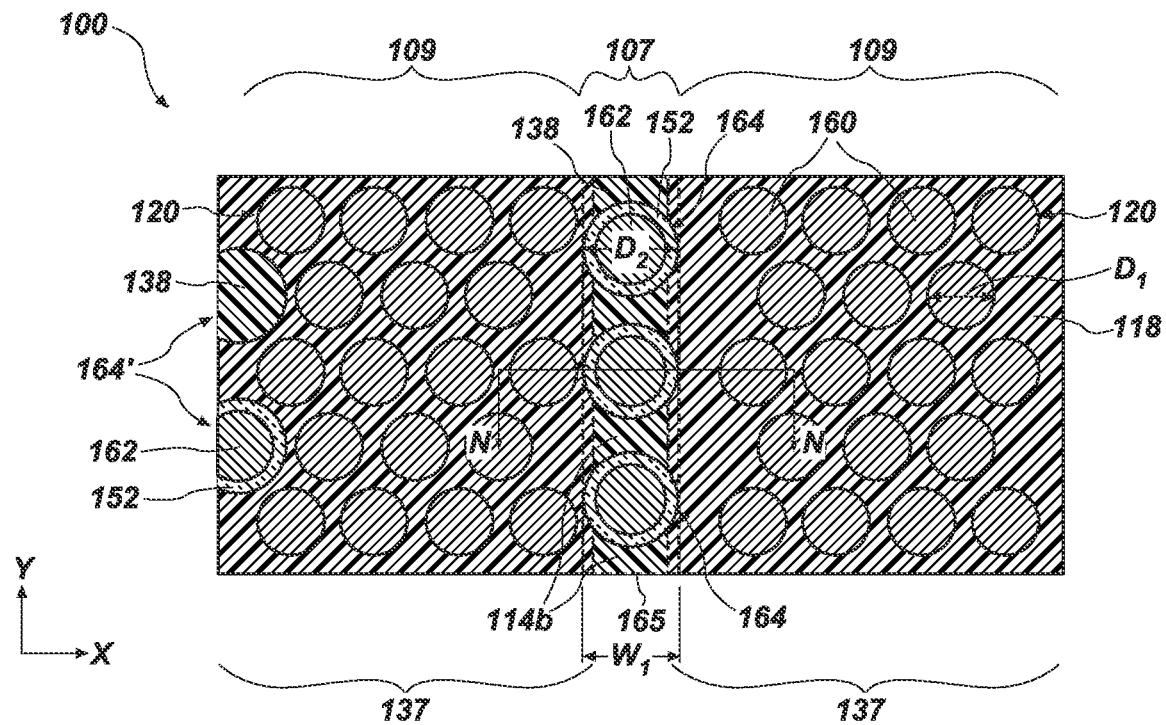
Figure 1P:
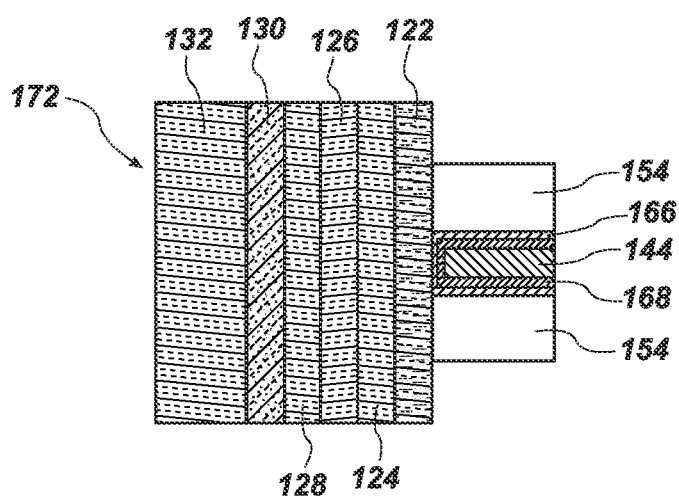

FIGS. 1A through 1P illustrate a method of forming an electronic device (e.g., a memory device, such as a 3D NAND Flash memory device), in accordance with embodiments of the disclosure, of which FIG. 1P is an enlargement of the portion of FIG. 1N indicated by the dashed line of box 172. FIG. 1A is a simplified cross-sectional view of an electronic device 100 taken along the A-A line of FIG. 1B. The electronic device 100 may, for example, be formed into a portion of a memory device, as described in further detail below.

With reference to FIG. 1A, the electronic device 100 may be formed to include a stack 101 (e.g., a preliminary stack) including a vertically (e.g., in the Z-direction) alternating sequence of insulative structures 106 and additional insulative structures 108 arranged in tiers 112. Each of the tiers 112 may include one of the insulative structures 106 directly vertically adjacent at least one of the additional insulative structures 108. For convenience in describing FIGS. 1A through 1P, a first direction may be defined as the X-direction and a second direction, which is orthogonal (e.g., perpendicular) to the first direction, as the Y-direction. A third direction, which is orthogonal (e.g., perpendicular) to each of the first direction and the second direction, may be defined as the Z-direction.

The electronic device 100 is formed to include a source 102 underlying a first deck 103 of the stack 101, a first barrier material 104 separating the source 102 from a lowermost one of the insulative structures 106 of the stack 101, and a second deck 105 (FIG. 1D) overlying the first deck 103. The electronic device 100 includes a slot region 107 horizontally neighboring (e.g., in the X-direction) one or more pillar array regions 109 (e.g., memory array regions). As described in further detail below, the electronic device 100 further includes additional components (e.g., features, structures, devices) within boundaries of the different regions. The electronic device 100 is formed to include an etch stop material 114 underlying (e.g., at the bottom of) a first slot 111 within the slot region 107 and an additional etch stop material 115 underlying (e.g., at the bottom of) first pillar openings 110 within the pillar array regions 109. As described below, the first slot 111 may divide the stack 101 of the electronic device 100 into separate blocks. While FIG. 1A illustrates a single (e.g., only one) first slot 111 within a single slot region 107 horizontally neighboring two of the pillar array regions 109, additional first slots 111 including subsequently formed structures may be included within additional slot regions 107 separating additional pillar array regions 109 of the electronic device 100.

A number (e.g., quantity) of the tiers 112 of the stack 101 may be within a range from about 32 of the tiers 112 to about 256 of the tiers 112. In some embodiments, the stack 101 includes about 128 of the tiers 112. However, the disclosure is not so limited, and the stack 101 may include a different number of the tiers 112. The stack 101 may comprise at least one (e.g., one, two, more than two) deck structure vertically overlying a source 102. For example, the stack 101 may comprise a single deck structure (e.g., the first deck 103) or a dual deck structure for a 3D memory device (e.g., a 3D NAND Flash memory device) including the first deck 103 and the second deck 105 (FIG. 1D). The first deck 103 (e.g., a lower deck) of the stack 101 may, optionally, be separated from the second deck 105 (e.g., an upper deck) by an interdeck region 134 (FIG. 1D).

The insulative structures 106 may be formed of and include, for example, at least one dielectric material, such as at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$). In some embodiments, the insulative structures 106 are formed of and include $SiO_2$.

The additional insulative structures 108 may be formed of and include an insulative material that is different than (e.g., has a different chemical composition than), and exhibits an etch selectivity with respect to, the insulative structures 106. The additional insulative structures 108 may be formed of and include at least one dielectric nitride material (e.g., $SiN_y$) or at least one oxynitride material (e.g., $SiO_xN_y$). In some embodiments, the additional insulative structures 108 are formed of and include $Si_3N_4$.

Prior to forming the stack 101, the first barrier material 104 may be formed adjacent to (e.g., vertically adjacent to, on) the source 102. The source 102 and the lowermost one of the insulative structures 106 of the stack 101 are separated from one another by the first barrier material 104. The first barrier material 104 may be formed of and include at least one insulative material. For example, the first barrier material 104 may comprise a nitride material (e.g., a silicon nitride material, an oxynitride material) located over an upper surface of the source 102, and may function as an etch stop material. In some embodiments, the first barrier material 104 comprises a carbon-containing material (e.g., carbon-doped silicon nitride, silicon carbon nitride (SiCN)). As other non-limiting examples, the first barrier material 104 may be formed of and include one or more of silicon, polysilicon, tungsten (W), titanium (Ti), titanium nitride (TiN), aluminum oxide ($AlO_x$), or another material, so long as the first barrier material 104 is electrically isolated from a lowermost one of the conductive structures of the stack 101. For example, spacing between the first barrier material 104 and the lowermost one of the conductive structures of the stack 101 may be increased to reduce or eliminate parasitic (e.g., stray) capacitance between adjacent conductive features during use and operation of the electronic device 100. In some embodiments, the first barrier material 104 comprises amorphous silicon or polycrystalline silicon. In some such embodiments, the first barrier material 104 may be doped with one or more dopants, such as with at least one n-type dopant (e.g., one or more of arsenic, phosphorous, antimony, and bismuth) or at least one p-type dopant (e.g., one or more of boron, aluminum, and gallium). In other embodiments, the first barrier material 104 comprises tungsten. The first barrier material 104 may be substantially homogeneous, or the first barrier material 104 may be heterogeneous.

The first barrier material 104 may include a material composition that is different than a material composition of the insulative structures 106 and the additional insulative structures 108 of the tiers 112, so that the first barrier material 104 is selectively etchable relative to the insulative structures 106 and the additional insulative structures 108. A material composition of the first barrier material 104 may also be different than a material composition of subsequently formed materials and structures (e.g., the etch stop material 114, the additional etch stop material 115, sacrificial structures 117 (FIG. 1C), and an additional sacrificial structure 119 (FIG. 1C)), so that the first barrier material 104 is selectively etchable relative to each of the subsequently formed materials and structures.

Following formation of the first barrier material 104, the etch stop material 114 (e.g., a pillar region etch stop material 114) and the additional etch stop material 115 (e.g., a slot region etch stop material 115) may be formed within the first barrier material 104. For example, the etch stop material 114 may be formed to extend within a portion of the first barrier material 104 within the slot region 107. The additional etch stop material 115 may be formed to extend through the first barrier material 104 to the source 102 within the pillar array regions 109. In some embodiments, the additional etch stop material 115 extends to an upper surface of the source 102. In other embodiments, the additional etch stop material 115 extends beyond the upper surface and into at least a portion of the source 102, as shown in FIG. 1A. Thus, the etch stop material 114 is formed to extend within an upper portion of the first barrier material 104 without extending therethrough (e.g., without extending to the upper surface of the source 102), and the additional etch stop material 115 directly contacts at least a portion of the source 102.

As shown in FIG. 1A, a thickness $T_1$ (e.g., in the Z-direction) of the additional etch stop material 115 may be within a range from about 40 nm to about 200 nm, such as from about 40 nm to about 60 nm, from about 60 nm to about 80 nm, from about 80 nm to about 100 nm, from about 100 nm to about 150 nm, or from about 150 nm to about 200 nm. In some embodiments, the thickness $T_1$ is about 80 nm. However, the disclosure is not so limited and the thickness $T_1$ may be different than that described above. A thickness $T_2$ of the first barrier material 104 may be within a range from about 20 nm to about 100 nm, such as from about 20 nm to about 40 nm, from about 40 nm to about 60 nm, from about 60 nm to about 80 nm, or from about 80 nm to about 100 nm. In some embodiments, the thickness $T_2$ is about 40 nm. However, the disclosure is not so limited and the thickness $T_2$ may be different than those described. In addition, a thickness $T_3$ of the etch stop material 114 may be within a range of from about 10 nm to about 60 nm, such as from about 10 nm to about 20 nm, from about 20 nm to about 40 nm, or from about 40 nm to about 60 nm. In some embodiments, the thickness $T_3$ is about 20 nm. However, the disclosure is not so limited and the thickness $T_3$ may be different than those described. In some embodiments, the thickness $T_2$ is less than the thickness $T_1$, and the thickness $T_3$ is less than each of the thickness $T_1$ and the thickness $T_2$. In other embodiments, the thickness $T_3$ of the etch stop material 114 is substantially the same as the thickness $T_2$ of the first barrier material 104.

The etch stop material 114 and the additional etch stop material 115 may be selectively etchable relative to one or more of the first barrier material 104, the insulative structures 106, the additional insulative structures 108, as well as subsequently formed materials and structures within the first pillar openings 110 and the first slot 111. The etch stop material 114 and the additional etch stop material 115 may, for example, comprise one or more of at least one semiconductive material (e.g., a silicon material, such as polysilicon), at least one conductive material, and at least one dielectric material (e.g., one or more of a dielectric oxide, a dielectric nitride, a dielectric oxynitride, and a dielectric carboxynitride). In some embodiments, the etch stop material 114 and the additional etch stop material 115 are formed of and include polysilicon. In additional embodiments, the etch stop material 114 and the additional etch stop material 115 are formed of and include one or more of tungsten and titanium nitride. In further embodiments, the etch stop material 114 and the additional etch stop material 115 are formed of and include aluminum oxide. The etch stop material 114 and the additional etch stop material 115 may or may not include substantially the same material composition as one another.

The etch stop material 114 and the additional etch stop material 115 may be formed using one or more conventional deposition processes, such as one or more of an ALD process, a CVD process, and a PVD process. In some embodiments, portions of one or more of the first barrier material 104 and the source 102 are removed (e.g., through a conventional photolithographic patterning and etching process) to form openings therein; an etch stop material is formed (e.g., deposited) into the openings; and excess portions of the etch stop material are removed (e.g., through a CMP process) to form the etch stop material 114 and the additional etch stop material 115. Upper surfaces of the etch stop material 114 may be substantially vertically coplanar with upper surfaces of the additional etch stop material 115. Upper surfaces of the etch stop material 114 and the additional etch stop material 115 may also be substantially vertically coplanar with upper surfaces of the first barrier material 104. The etch stop material 114 may be at least partially horizontally aligned in a first horizontal direction (e.g., the X-direction) with portions of the additional etch stop material 115. An elongated portion of the etch stop material 114 underlying the first slot 111 extends in a second horizontal direction (e.g., the Y-direction) substantially orthogonal to each of the first horizontal direction and a vertical direction (e.g., the Z-direction). The etch stop material 114 may be formed to include a substantially continuous material adjacent to (e.g., underlying) the first slot 111 of the slot region 107. The etch stop material 114 may exhibit a greater lateral extent (e.g., a width in the X-direction) than a lateral extent of the first slot 111, as shown in FIG. 1A, or, alternatively, sidewalls of the etch stop material 114 may be substantially aligned with sidewalls of the first slot 111. In other words, portions of the etch stop material 114 may be adjacent to (e.g., underlying) the lowermost one of the insulative structures 106. The additional etch stop material 115 may include segmented portions thereof adjacent to (e.g., underlying) respective first pillar openings 110 of the pillar array regions 109. The additional etch stop material 115 may exhibit a greater lateral extent than a lateral extent of the first pillar openings 110 or, alternatively, sidewalls of the additional etch stop material 115 may be substantially aligned with sidewalls of the first pillar openings 110, as shown in FIG. 1A.

In some embodiments, one or more (e.g., both) of the etch stop material 114 and the additional etch stop material 115 may serve as (e.g., function as) sacrificial structures. For example, in embodiments including the additional etch stop material 115 comprising at least one dielectric material, the additional etch stop material 115 may be removed (e.g., exhumed) prior to formation of pillars (e.g., memory pillars) extending through the stack 101, such that a channel material of the pillars is electrically connected to the source 102. In embodiments including the additional etch stop material 115 comprising a conductive material, for example, the additional etch stop material 115 may remain in the electronic device 100, without being removed and replaced with subsequently formed materials. In such embodiments, the additional etch stop material 115 may exhibit etch selectivity to surrounding materials without serving as sacrificial structures. In addition, at least portions of the etch stop material 114 may serve as sacrificial structures and additional portions thereof may remain in the electronic device 100, without being removed and replaced with subsequently formed materials, as described in further detail with reference to FIG. 1F.

Following formation of the etch stop material 114 and the additional etch stop material 115 within the first barrier material 104, the stack 101 may be formed on or over the source 102 (e.g., a source tier, a source plate). For example, the first deck 103 of the stack 101 may be formed on or over the source 102 and the first barrier material 104 including the etch stop material 114 and the additional etch stop material 115. The source 102 may be formed of and include a conductive material such as, for example, a semiconductor material (e.g., polysilicon) doped with at least one p-type dopant (e.g., one or more of boron, aluminum, and gallium) or at least one n-type dopant (e.g., arsenic, phosphorous, antimony). While not illustrated in FIG. 1A, complementary metal-oxide-semiconductor (CMOS) circuitry may, for example, be present below the source 102, as described below with reference to FIG. 1N and FIG. 2.

The lowermost one of the insulative structures 106 of the stack 101 may be located adjacent the first barrier material 104. The lowermost one of the insulative structures 106 may be also be located adjacent (e.g., directly on) the etch stop material 114 and the additional etch stop material 115. As will be described herein, during fabrication of electronic device 100, one or more portions of the additional insulative structures 108 may be replaced to form conductive structures, such as select gate structures, which may comprise one or more select gate drain (SGD) structures, and an additional select gate structure, which may comprise a select gate source (SGS) structure. In addition, at least some of the insulative structures 106 may be replaced (e.g., substantially entirely replaced) with or, alternatively, supplemented with air gaps.

With continued reference to FIG. 1A and FIG. 1B, following formation of the first deck 103 of the stack 101 and prior to formation of the second deck 105 (FIG. 1D), the first pillar openings 110 may be formed through the stack 101 to, for example, expose the additional etch stop material 115 adjacent to the source 102 within the pillar array regions 109. The first pillar openings 110 may be formed by conventional techniques. As will be described herein, extended openings of the first pillar openings 110 may be used to form pillars 120 (FIG. 1E) for forming strings (e.g., strings 170 (FIG. 1K)) of memory cells (e.g., memory cells 172 (FIG. 1K)). The first slot 111 may be formed through the stack 101 to, for example, expose the etch stop material 114 within the slot region 107. The first slot 111 may be formed by conventional techniques. Thus, lower vertical boundaries of the first pillar openings 110 may be defined by the upper surfaces of the additional etch stop material 115 and a lower vertical boundary of the first slot 111 may be defined by the upper surface of the etch stop material 114. Horizontal boundaries of the first pillar openings 110 and the first slot 111 may be defined by surfaces (e.g., side surfaces) of the first deck 103 of the stack 101 (e.g., surfaces of the insulative structures 106 and the additional insulative structures 108 of the tiers 112).

The first slot 111 may be formed laterally adjacent to the first pillar openings 110 and exhibit a height substantially similar to (e.g., the same as) a height of the first pillar openings 110. The first slot 111 may be formed during the same material removal act used to form the first pillar openings 110 or, alternatively, using one or more additional material removal acts. For example, the first slot 111 may be formed during formation of the first pillar openings 110 using a single (e.g., one) masking act to reduce cost and the number of process acts conducted.

Referring to FIG. 1B, the first pillar openings 110 that laterally neighbor one another in the Y-direction may be offset from each other in the X-direction. Accordingly, the first pillar openings 110 may be arranged in a so-called "weave pattern," which may facilitate an increased density of the pillars 120 (FIG. 1E) and the resulting strings (e.g., the strings 170 (FIG. 1K)) of the memory cells (e.g., the memory cells 172 (FIG. 1K)) to be formed in the first pillar openings 110. However, the disclosure is not so limited and the first pillar openings 110 may be arranged in other patterns (e.g., lines wherein the first pillar openings 110 of each line are aligned with the first pillar openings 110 of each of the other lines). In some embodiments, each first pillar opening 110 may be surrounded by six (6) other first pillar openings 110 and may be arranged in a hexagonal pattern.

The first pillar openings 110 may have any suitable transverse cross-sectional shape such as, for example, a substantially circular cross-sectional shape or a substantially rectangular cross-sectional shape (e.g., a substantially square cross-sectional shape). The first pillar openings 110 may have a horizontal dimension (e.g., diameter) $D_1$ within a range from about 60 nm to about 120 nm, such as from about 60 nm to about 80 nm, from about 80 nm to about 100 nm, or from about 100 nm to about 120 nm. In some embodiments, the horizontal dimension $D_1$ is about 100 nm. However, the disclosure is not so limited and the horizontal dimension $D_1$ may be different than those described. A horizontal dimension (e.g., a width $W_1$ in the X-direction) of the first slot 111, as well as extended slots formed thereafter, may be within a range of from about 90 nm to about 300 nm, such as from about 90 nm to about 120 nm, from about 120 nm to about 150 nm, from about 150 nm to about 200 nm, or from about 200 nm to about 300 nm. In some embodiments, the width $W_1$ is about 150 nm. However, the disclosure is not so limited and the width $W_1$ may be different than those described. Accordingly, the width $W_1$ of the first slot 111 of the electronic device 100 may be relatively less than that of conventional slots of conventional electronic devices. The reduced width $W_1$ of the first slot 111 relative to that of conventional slots may provide a greater cross-sectional area for formation of the conductive structures of a conductive stack, which in turn may provide a reduced resistivity (e.g., electrical resistance levels) of the conductive materials thereof without significantly affecting conductivity.

Referring to FIG. 1C, the sacrificial structures 117 may be formed in the first pillar openings 110 within the pillar array regions 109 and the additional sacrificial structure 119 may be formed in the first slot 111 within the slot region 107. The sacrificial structures 117 and the additional sacrificial structure 119 may be configured and positioned to protect the materials (e.g., the insulative structures 106, the additional insulative structures 108) of the first deck 103 during additional processing acts to form the second deck 105 over the stack 101.

The material of the sacrificial structures 117 and the additional sacrificial structure 119 may be selectively etchable relative to one or more of the first barrier material 104, the insulative structures 106, the additional insulative structures 108, the etch stop material 114, and the additional etch stop material 115. The sacrificial structures 117 and the additional sacrificial structure 119 may, for example, comprise one or more of at least one semiconductive material (e.g., a silicon material, such as polysilicon), at least one conductive material, and at least one dielectric material (e.g., one or more of a dielectric oxide, a dielectric nitride, a dielectric oxynitride, and a dielectric carboxynitride). In some embodiments, the sacrificial structures 117 and the additional sacrificial structure 119 are formed of and include polysilicon. In additional embodiments, the sacrificial structures 117 and the additional sacrificial structure 119 are formed of and include one or more of tungsten and titanium nitride. In further embodiments, the sacrificial structures 117 and the additional sacrificial structure 119 are formed of and include aluminum oxide. The sacrificial structures 117 and the additional sacrificial structure 119 may or may not include substantially the same material composition as one another.

After forming the sacrificial structures 117 and the additional sacrificial structure 119, the electronic device 100 may be exposed to a chemical mechanical planarization (CMP) process to remove additional material outside of the first pillar openings 110 and the first slot 111 and to isolate individual portions thereof.

Referring to FIG. 1D, following formation of the sacrificial structures 117 and the additional sacrificial structure 119 within the first deck 103 of the stack 101, and prior to formation of the second deck 105, an insulative material of the interdeck region 134 and plugs 136 may, optionally, be formed to separate the first deck 103 from the second deck 105. The electronic device 100 may also be formed to include an optional sacrificial material 113 overlying the second deck 105 and an upper insulative material 116 overlying the sacrificial material 113, if present.

In some embodiments, the second deck 105 may be separated from the first deck 103 by the insulative material of the interdeck region 134, which may also be referred to herein as an inter-deck oxide. The insulative material of the interdeck region 134 may comprise an oxide material such as, for example, silicon dioxide, aluminum oxide, or another material. In some embodiments, the insulative material of the interdeck region 134 has a different material composition than the material composition of the insulative structures 106 and the additional insulative structures 108. In other embodiments, the insulative material of the interdeck region 134 has substantially the same material composition as the insulative structures 106. If present, the interdeck region 134 may have a vertical thickness $T_5$ that is relatively greater than respective vertical thicknesses $T_4$ of the insulative structures 106 of the stack 101.

The plugs 136 may be formed at upper vertical boundaries (e.g., in the Z-direction) of the sacrificial structures 117 within the pillar array regions 109 to substantially fill (e.g., plug, cover) an upper portion of the sacrificial structures 117, as shown for simplicity in the right-hand pillar array region 109 in the view of FIG. 1D. If present, the plugs 136 may be formed to extend vertically (e.g., in the Z-direction) into the insulative material of the interdeck region 134 and may cover the sacrificial structures 117 within the first pillar openings 110 (FIG. 1C). The plugs 136 may be configured and positioned to protect the sacrificial structures 117 during additional processing acts to form the second deck 105 over the stack 101. Each of the plugs 136 may be at least partially (e.g., substantially) horizontally aligned (e.g., in the X-direction and in the Y-direction) with the sacrificial structures 117 vertically thereunder. In some embodiments, the plugs 136 may also be formed to cover the additional sacrificial structure 119 within the slot region 107. The plugs 136 may be confined within vertical boundaries of the interdeck region 134. For example, the plugs 136 may not extend into portions of the first deck 103 of the stack 101 underlying the interdeck region 134. Horizontal boundaries of the plugs 136 may be defined by side surfaces of the insulative material of the interdeck region 134.

The plugs 136 may individually be formed to exhibit a desired size and shape to cover (e.g., plug, enclose) the sacrificial structures 117. In some embodiments, each of the plugs 136 is individually formed to exhibit a transverse cross-sectional shape (e.g., a substantially circular cross-sectional shape or a substantially rectangular cross-sectional shape (e.g., a substantially square cross-sectional shape)), and is sized and positioned to cover the sacrificial structures 117. For example, the plugs 136 may exhibit a substantially circular cross-sectional shape having a substantially circular cross-sectional area sized and positioned to completely cover a cross-sectional area of the sacrificial structures 117. As shown in FIG. 1D, the plugs 136 may extend beyond horizontal boundaries of the sacrificial structures 117. In other embodiments, the plugs 136 may exhibit one or more of a different size and shape so long as the plugs 136 cover the sacrificial structures 117. In embodiments including the plugs 136 formed over the additional sacrificial structure 119, the plugs 136 may be elongated in a direction of the first slot 111 (e.g., the Y-direction) (See FIG. 1).

The plugs 136 may be formed of and include at least one material formulated to protect one or more of the sacrificial structures 117 and the additional sacrificial structure 119 during additional processing acts to form the second deck 105 over the first deck 103 of the stack 101. The material of the plugs 136 may be selectively etchable relative to one or more of the insulative material of the interdeck region 134, the insulative structures 106, the additional insulative structures 108, and the upper insulative material 116. The plugs 136 may, for example, comprise one or more of at least one semiconductive material (e.g., a silicon material, such as polysilicon), at least one conductive material, and at least one dielectric material (e.g., one or more of a dielectric oxide, a dielectric nitride, a dielectric oxynitride, and a dielectric carboxynitride). In some embodiments, the plugs 136 are formed of and include polysilicon. In additional embodiments, the plugs 136 are formed of and include tungsten. In further embodiments, the plugs 136 are formed of and include titanium nitride.

In other embodiments, the electronic device 100 may not include the interdeck region 134 and the plugs 136 between the first deck 103 and the second deck 105. In some such embodiments, a lowermost one of the additional insulative structures 108 of the second deck 105 may be formed adjacent to (e.g., directly on) an uppermost one of the insulative structures 106 of the first deck 103, such that the stack 101 of the electronic device 100 is formed without formation of the interdeck region 134 and the plugs 136, as shown for simplicity in the left-hand pillar array region 109 in the view of FIG. 1D. In other words, the lowermost one of the additional insulative structures 108 of the second deck 105 may be formed directly on the uppermost one of the insulative structures 106 of the first deck 103 without intervening materials. While FIGS. 1D and 1E show the plug 136 in the right-hand pillar array region 109 and no plug 136 in the left-hand pillar array region 109, the electronic device 100 would include multiple plugs 136 or no plugs 136 rather than a combination of plugs 136 and no plugs 136.

The second deck 105 may be formed on or over the first deck 103 of the stack 101, as well as the interdeck region 134 and the plugs 136, if present. The second deck 105 may include a vertically alternating sequence of the insulative structures 106 and the additional insulative structures 108 arranged in the tiers 112, and the upper insulative material 116 may be formed on or over the second deck 105. The tiers 112 may be formed by conventional techniques. A number (e.g., quantity) of the tiers 112 of the second deck 105 may be equal to (e.g., the same as) a number of the tiers 112 of the first deck 103, or a quantity of the tiers 112 of the second deck 105 may be different than (e.g., less than, greater than) a quantity of the tiers 112 of the first deck 103. In other embodiments, the stack 101 includes a single deck (e.g., the first deck 103) extending between the source 102 and the upper insulative material 116. In some such embodiments, the single deck may be formed without forming the insulative material of the interdeck region 134 and the plugs 136. While FIGS. 1D-1N illustrate the interdeck region 134, the interdeck region 134 may not be present in some embodiments.

Following formation of the second deck 105, the sacrificial material 113 may, optionally, be formed over an uppermost one of the insulative structures 106 of the second deck 105. The sacrificial material 113 may be selectively etchable relative to one or more of the insulative structures 106, the additional insulative structures 108, and the upper insulative material 116. If present, the sacrificial material 113 may include a material composition similar to a material composition of the sacrificial structures 117 and the additional sacrificial structure 119 (e.g., polysilicon, tungsten, titanium nitride, or aluminum oxide).

Formation of the sacrificial material 113 may facilitate formation of one or more staircase structures (e.g., a staircase structure 220 (FIG. 2)) within a staircase region (e.g., a staircase region 221 (FIG. 2)) horizontally adjacent to the pillar array regions 109. The staircase structures 220 are not shown in the perspectives of FIGS. 1A-1P. The staircase structures 220 may be formed to include steps comprising edges (e.g., horizontal ends) of the tiers 112 of the insulative structures 106 and the additional insulative structures 108. For example, the staircase structures may be formed in the stack 101 within horizontal boundaries of the staircase region of the electronic device 100 using conventional processes (e.g., conventional photolithographic patterning processes, conventional material removal processes), and conventional processing equipment, which are not described in detail herein. Following formation of the steps of the staircase structures, a dielectric fill material may be formed thereover, and excess portions of the dielectric fill material may be removed (e.g., through a CMP process). The sacrificial material 113, if present, may be configured and positioned to protect the materials of the second deck 105 within the slot region 107 and the pillar array regions 109 during processing acts to form the staircase structures. Upon formation of the staircase structures, the sacrificial material 113 may be removed prior to forming the upper insulative material 116.

The upper insulative material 116, which may serve as a mask material, may overlie an uppermost one of the tiers 112 of the stack 101. The upper insulative material 116 may exhibit an etch selectivity relative to one or more of the insulative structures 106 and the additional insulative structures 108. The upper insulative material 116 may include, by way of non-limiting example, one or more of polysilicon, a dielectric material, a nitride material (e.g., silicon nitride), a metal oxide (e.g., aluminum oxide, titanium oxide, tantalum oxide, tungsten oxide). In some embodiments, the upper insulative material 116 comprises polysilicon. In other embodiments, the upper insulative material 116 includes substantially the same material composition as a material composition of the insulative structures 106 (e.g., $SiO_2$).

With continued reference to FIG. 1D, second pillar openings 110' (e.g., upper portions of the first pillar openings 110) may be formed to extend vertically through the upper insulative material 116 and the second deck 105 of the stack 101 to expose upper surfaces of the plugs 136 or, alternatively, to expose upper surfaces of the sacrificial structures 117. The second pillar openings 110' may be formed within the pillar array regions 109 without exposing the additional sacrificial structure 119 within the slot region 107.

During formation of the second pillar openings 110', additional openings 140' (e.g., additional support pillar openings (FIG. 1J)) may be formed within the electronic device 100. Formation of the additional openings 140' may facilitate subsequent formation of additional support pillars (e.g., additional support pillars 164' (FIG. 1O)) within one or more of the pillar array regions 109 and the staircase region 221 (FIG. 2), as described in further detail below. By forming the additional openings 140' during formation of the second pillar openings 110', manufacturing costs may be reduced.

Referring to FIGS. 1E and 1F, the sacrificial structures 117 (FIG. 1D) and underlying portions of the additional etch stop material 115 (FIG. 1D) may be removed (e.g., exhumed) to expose the source 102 and to form extended openings. One or more materials may be formed within the extended openings to form the pillars 120 including the one or more materials. FIG. 1E is a simplified cross-sectional view of the electronic device 100 taken along the E-E line of FIG. 1F, which is a simplified top-down view of the electronic device 100. With reference to FIGS. 1E and 1F, the pillars 120 may extend vertically (e.g., in the Z-direction) through the stack 101, including the first deck 103 and the second deck 105.

Portions of the plug material of the plugs 136, if present, may be selectively removed (e.g., exhumed) to expose respective portions of the sacrificial structures 117 (FIG. 1D). In embodiments including the interdeck region 134 and the plugs 136, the interdeck region 134 and portions of the plugs 136 may remain in the electronic device 100. For convenience, remaining portions of the plugs 136 are not shown in subsequent drawings, although it is understood that the remaining portions of the plugs 136 may be present in the electronic device 100, in some embodiments.

The materials of the sacrificial structures 117 and, optionally, the additional etch stop material 115 may be substantially removed (e.g., exhumed) to form extended pillar openings 110" extending vertically through each of the first deck 103 and the second deck 105 of the stack 101. In some embodiments, the materials of each of the sacrificial structures 117 and the additional etch stop material 115 are removed (e.g., substantially entirely removed) such that the electronic device 100 is substantially devoid (e.g., substantially absent) of the sacrificial structures 117 and the additional etch stop material 115. In additional embodiments, portions of one or more of the sacrificial structures 117 and the additional etch stop material 115 are selectively removed (e.g., etched) without entirely removing the materials thereof. In embodiments including the additional etch stop material 115 comprising a conductive material, at least a portion of the additional etch stop material 115 may remain in the electronic device 100. At the processing stage depicted in FIGS. 1E and 1F, the etch stop material 114 and the additional sacrificial structure 119 may still be present within the slot region 107.

In some embodiments, the extended pillar openings 110" may extend to the upper surface of the source 102. Horizontal boundaries of the extended pillar openings 110" may be defined by surfaces (e.g., side surfaces) of the first deck 103 and the second deck 105 of the stack 101 (e.g., surfaces of the insulative structures 106 and the additional insulative structures 108 of the tiers 112), the upper insulative material 116, and remaining portions of the plug material of the plugs 136, if present. A lower vertical boundary of the extended pillar openings 110" may be defined by the upper surface of the source 102. In other embodiments, the extended pillar openings 110" may extend into a portion of the source 102, as shown in FIG. 1E. Accordingly, the horizontal boundaries of the extended pillar openings 110" may also be defined by surfaces (e.g., side surfaces) of the source 102. The extended pillar openings 110" may be configured (e.g., sized and shaped) to receive subsequently formed structures (e.g., the materials of the pillars 120).

With continued reference to FIGS. 1E and 1F, the pillars 120 may extend vertically (e.g., in the Z-direction) through the stack 101. As will be described herein, the materials of the pillars 120 may be employed to form memory cells (e.g., strings of NAND memory cells). The pillars 120 may each individually comprise a dielectric blocking material 122 horizontally neighboring the levels of the insulative structures 106 and the additional insulative structures 108 of one of the tiers 112 of the stack 101; a charge blocking material 124 (also referred to as a "dielectric blocking material") horizontally neighboring the dielectric blocking material 122; a memory material 126 horizontally neighboring the charge blocking material 124; a tunnel dielectric material 128 (also referred to as a "tunneling dielectric material") horizontally neighboring the memory material 126; a channel material 130 horizontally neighboring the tunnel dielectric material 128; and an insulative material 132 in a center portion of the pillars 120. The channel material 130 may be horizontally interposed between the insulative material 132 and the tunnel dielectric material 128; the tunnel dielectric material 128 may be horizontally interposed between the channel material 130 and the memory material 126; the memory material 126 may be horizontally interposed between the tunnel dielectric material 128 and the charge blocking material 124; the charge blocking material 124 may be horizontally interposed between the memory material 126 and the dielectric blocking material 122; and the dielectric blocking material 122 may be horizontally interposed between the charge blocking material 124 and the levels of the insulative structures 106 and additional insulative structures 108.

The dielectric blocking material 122 may be formed of and include one or more of a metal oxide (e.g., one or more of aluminum oxide, hafnium oxide, zirconium oxide, lanthanum oxide, yttrium oxide, tantalum oxide, gadolinium oxide, niobium oxide, titanium oxide), a dielectric silicide (e.g., aluminum silicide, hafnium silicate, zirconium silicate, lanthanum silicide, yttrium silicide, tantalum silicide), and a dielectric nitride (e.g., aluminum nitride, hafnium nitride, lanthanum nitride, yttrium nitride, tantalum nitride). In some embodiments, the dielectric blocking material 122 comprises aluminum oxide. In other embodiments, the pillars 120 do not include the dielectric blocking material 122, and the charge blocking material 124 horizontally neighbors the levels of the insulative structures 106 and additional insulative structures 108.

The charge blocking material 124 may be formed of and include a dielectric material such as, for example, one or more of an oxide (e.g., silicon dioxide), a nitride (silicon nitride), and an oxynitride (silicon oxynitride), or another material. In some embodiments, the charge blocking material 124 comprises silicon oxynitride.

The memory material 126 may comprise a charge trapping material or a conductive material. The memory material 126 may be formed of and include one or more of silicon nitride, silicon oxynitride, polysilicon (doped polysilicon), a conductive material (tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 126 comprises silicon nitride.

The tunnel dielectric material 128 may be formed of and include a dielectric material through which charge tunneling can be performed under suitable electrical bias conditions, such as through hot-carrier injection or by Fowler-Nordheim tunneling induced charge transfer. By way of non-limiting example, the tunnel dielectric material 128 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric material 128 comprises silicon dioxide. In other embodiments, the tunnel dielectric material 128 comprises nitrogen, such as an oxynitride. In some such embodiments, the tunnel dielectric material 128 comprises silicon oxynitride.

In some embodiments the tunnel dielectric material 128, the memory material 126, and the charge blocking material 124 together may comprise a structure configured to trap a charge, such as, for example, an oxide-nitride-oxide (ONO) structure. In some such embodiments, the tunnel dielectric material 128 comprises silicon dioxide, the memory material 126 comprises silicon nitride, and the charge blocking material 124 comprises silicon dioxide. In other embodiments, the tunnel dielectric material 128, the memory material 126, and the charge blocking material 124 together comprise an oxide-nitride-oxynitride structure. In some such embodiments, the tunnel dielectric material 128 comprises silicon oxynitride, the memory material 126 comprises silicon nitride, and the charge blocking material 124 comprises silicon dioxide.

The channel material 130 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 130 includes amorphous silicon or polysilicon. In some embodiments, the channel material 130 comprises a doped semiconductor material. The insulative material 132 may be formed of and include at least one insulative material. In some embodiments, the insulative material 132 comprises silicon dioxide.

After forming the pillars 120, vertically (e.g., in the Z-direction) surfaces of the electronic device 100 may be exposed to a chemical mechanical planarization (CMP) process to remove laterally (e.g., in the X-direction, in the Y-direction) portions of the dielectric blocking material 122, the charge blocking material 124, the memory material 126, the tunnel dielectric material 128, the channel material 130, and the insulative material 132.

Referring to FIG. 1F, the etch stop material 114 (shown in dashed lines) may include sacrificial portions 114a and remaining portions 114b proximate to and intervening between neighboring portions of the sacrificial portions 114a. For example, the sacrificial portions 114a of the etch stop material 114 may initially be present in one or more areas (shown in dashed lines) designated for the subsequently formed support pillars (e.g., support pillars 164 (FIG. 1O)) within the slot region 107, and the remaining portions 114b of the etch stop material 114 may be present in regions between the one or more areas designated for the support pillars. The etch stop material 114 may be formed to horizontally extend in the second horizontal direction (e.g., in the Y-direction) within the slot region 107, as described with reference to FIG. 1B. Accordingly, elongated portions of the etch stop material 114 may initially be formed to include a substantially continuous material in openings of the first barrier material 104 (FIG. 1E), and the remaining portions 114b of the etch stop material 114 may remain in the electronic device 100 following formation of the support pillars, as described below with reference to FIG. 1O. Further, one or more additional areas (shown in dashed lines) within the pillar array regions 109 may also be designated for subsequently formed additional support pillars (e.g., the additional support pillars 164' (FIG. 1O)), as shown in the left-hand pillar array region 109 in the view of FIG. 1F.

Referring now to FIG. 1G, a second barrier material 118 may be formed adjacent to (e.g., on or over) the upper insulative material 116 and the pillars 120. In some embodiments, the second barrier material 118 may include a material composition similar to a material composition of the first barrier material 104 including, for example, a nitride material, a carbon-containing material (e.g., carbon-doped silicon nitride, silicon carbon nitride), or one or more of polysilicon, tungsten, titanium, titanium nitride, and aluminum oxide. Accordingly, the second barrier material 118 may include a material composition that is different than a material composition of the insulative structures 106, the additional insulative structures 108, the etch stop material 114, and the upper insulative material 116, so that the second barrier material 118 is selectively etchable relative to such materials and structures.

A conductive contact structure 135 (e.g., a conductive plug) may be formed in electrical communication with the channel material 130 of the pillars 120. For example, in some embodiments, a portion of the insulative material 132 within the pillars 120 may be selectively removed to form a recessed portion in each of the pillars 120. After selectively removing the insulative material 132, the conductive contact structure 135 may be formed within the recess of each pillar 120 and in electrical communication with the channel material 130. The conductive contact structure 135 may be formed of and include a conductive material (e.g., polysilicon). The conductive contact structure 135 may comprise sharp corners or, alternatively, the conductive contact structure 135 may comprise rounded corners, as shown in FIG. 1G.

In other embodiments, the insulative material 132 of each pillar 120 may not be recessed. In some such embodiments, openings may be formed in the second barrier material 118 at locations corresponding to the locations of the pillars 120 to expose upper (e.g., in the Z-direction) portions of the channel material 130. The conductive contact structures 135 may be formed in the openings and in electrical communication with the channel material 130. In some embodiments, an additional channel material (e.g., such as a channel liner) is formed within the openings of the second barrier material 118 and in electrical communication with the channel material 130, and the conductive contact structures 135 are formed in remaining portions of the openings and in electrical communication with the additional channel material.

The conductive contact structure 135 may be in electrical communication with, for example, a conductive line for providing access to strings (e.g., the strings 170 (FIG. 1K)) of the memory cells (e.g., the memory cells 172 (FIG. 1K)) formed from the pillars 120.

Additional portions of the second barrier material 118 may be formed on or over upper surfaces of the conductive contact structures 135 and initial portions of the second barrier material 118, as shown in dashed lines for clarity. For ease of understanding the disclosure, the initial portions and the additional portions of the second barrier material 118 are hereinafter collectively referred to as the second barrier material 118, as shown in FIG. 1G. The second barrier material 118 may be homogeneous (e.g., may include a single material), or may be heterogeneous (e.g., may include a stack including at least two different materials). The additional portions of the second barrier material 118 may be configured and positioned to protect the pillars 120 including the conductive contact structures 135 during additional processing acts.

As shown in FIG. 1G, a second slot 111' (e.g., an upper portion of the first slot 111) may be formed to extend vertically through the second barrier material 118, the upper insulative material 116, and the second deck 105 of the stack 101 to expose the upper surface of the additional sacrificial structure 119 within the slot region 107.

Referring to FIG. 1H, a material of the additional sacrificial structure 119 (FIG. 1G) may be substantially removed (e.g., exhumed) to form an extended slot 111" extending vertically through the second barrier material 118, the upper insulative material 116, as well as the first deck 103 and the second deck 105 of the stack 101. In some embodiments, the material of the additional sacrificial structure 119 is removed (e.g., substantially entirely removed) such that the electronic device 100 is substantially devoid (e.g., substantially absent) of the additional sacrificial structure 119. In additional embodiments, portions of the additional sacrificial structure 119 are selectively removed (e.g., etched) without entirely removing the material thereof.

In some embodiments, the extended slot 111" may extend to an upper surface of the etch stop material 114. Horizontal boundaries of the extended slot 111" may be defined by surfaces (e.g., side surfaces) of the first deck 103 and the second deck 105 of the stack 101 (e.g., surfaces of the insulative structures 106 and the additional insulative structures 108 of the tiers 112), the upper insulative material 116, and the second barrier material 118. A lower vertical boundary of the extended slot 111" may be defined by the upper surface of the etch stop material 114. The extended slot 111" may be configured (e.g., sized and shaped) to receive subsequently formed structures (e.g., the support pillars 164 (FIG. 1N)) within designated portions thereof.

The extended slot 111" may divide the stack 101 into multiple blocks 137. The blocks 137 may each extend in substantially the same horizontal direction (e.g., the Y-direction) as one another, and neighboring blocks 137 may be horizontally separated (e.g., in the X-direction) from one another by the extended slot 111" within the slot region 107. Each of the blocks 137 may exhibit substantially the same geometric configuration (e.g., dimensions, shape) as each other of the blocks 137 in the pillar array regions 109. In addition, horizontally neighboring blocks 137 may all be horizontally separated from one another by substantially the same distance (e.g., corresponding to the width $W_1$ of the first slot 111 (FIG. 1B) and the extended slot 111"). Accordingly, the blocks 137 may be substantially uniformly (e.g., non-variably, equally, consistently) sized, shaped, and spaced relative to one another.

With continued reference to FIG. 1H, a third barrier material 138 may be formed in the extended slot 111" to extend vertically (e.g., in the Z-direction) through the stack 101. The third barrier material 138 may be formed to extend substantially entirely through the first deck 103 and the second deck 105 of the stack 101 within the slot region 107, substantially filling the extended slot 111". In some embodiments, the third barrier material 138 may include a material composition similar to a material composition of one or more of the first barrier material 104 and the second barrier material 118 including, for example, a nitride material, a carbon-containing material (e.g., carbon-doped silicon nitride, silicon carbon nitride), or one or more of polysilicon, tungsten, titanium, titanium nitride, and aluminum oxide. Accordingly, the third barrier material 138 may include a material composition that is different than a material composition of the insulative structures 106, the additional insulative structures 108, the etch stop material 114, and the upper insulative material 116, so that the third barrier material 138 is selectively etchable relative to such materials and structures. In other embodiments, a material composition of the third barrier material 138 may differ from a material composition of one or more (e.g., each) of the first barrier material 104 and the second barrier material 118, so long as the third barrier material 138 is selectively etchable relative to the surrounding materials and structures.

As will be described herein, portions of the third barrier material 138 remain in the electronic device 100 following formation of conductive structures of a conductive stack, without being removed and replaced with subsequently formed materials. In other words, portions of the third barrier material 138 may remain within the extended slot 111" of the slot region 107 without serving as sacrificial structures. For example, the third barrier material 138 may include sacrificial portions overlying the sacrificial portions 114a (FIG. 1F) of the etch stop material 114 and remaining portions overlying the remaining portions 114b (FIG. 1F) of the etch stop material 114 proximate to and intervening between neighboring portions of the sacrificial portions of the third barrier material 138. Similar to the sacrificial portions 114a of the etch stop material 114, the sacrificial portions of the third barrier material 138 may initially be formed in one or more areas designated for the subsequently formed support pillars (e.g., support pillars 164 (FIG. 1O)) within the slot region 107, and the remaining portions of the third barrier material 138 may be formed in regions between the one or more areas designated for the support pillars.

By providing the portions of the third barrier material 138 that remain within the slot region 107 during formation of the conductive structures, such configurations may, for example, reduce or substantially prevent undesirable tier deformations (e.g., tier warping) and/or tier collapse during the formation of the conductive structures. For example, the third barrier material 138 may be formed within the extended slot 111" of the slot region 107 of the stack 101 prior to conducting replacement gate processing acts, and portions of the third barrier material 138 may remain within the slot region 107 during such processing acts to provide further structural support to the stack 101 during the formation of the conductive structures. Such a configuration may substantially prevent the risk of undesirable current leakage and short circuits during use and operation of the electronic device 100 without significantly affecting conductivity.

Referring to FIGS. 1I and 1J, after forming the third barrier material 138 within the slot region 107, portions thereof may be selectively removed (e.g., etched) to expose respective portions of the etch stop material 114 and to form openings 140 (e.g., support pillar openings). FIG. 1I is a simplified cross-sectional view of the electronic device 100 taken along the I-I line of FIG. 1J, which is a simplified top-down view of the electronic device 100. With reference to FIGS. 1I and 1J, the openings 140 may extend vertically through the stack 101, including the first deck 103 and the second deck 105.

The openings 140 may extend to the upper surface of the etch stop material 114. Horizontal boundaries of the openings 140 may be defined by surfaces (e.g., side surfaces) of the first deck 103 and the second deck 105 of the stack 101 (e.g., surfaces of the insulative structures 106 and the additional insulative structures 108 of the tiers 112), the upper insulative material 116, the second barrier material 118, and the remaining portions of third barrier material 138. A lower vertical boundary of the openings 140 may be defined by the upper surface of the etch stop material 114. The openings 140 may be configured (e.g., sized and shaped) to receive subsequently formed structures (e.g., the support pillars 164 (FIG. 1N)).

At the processing stage depicted in FIGS. 1I and 1J, the sacrificial portions 114a of the etch stop material 114 may still be present within the slot region 107, such that the etch stop material 114 includes the substantially continuous material along a length of the extended slot 111" (FIG. 1H) within the slot region 107. In other words, the sacrificial portions 114a of the etch stop material 114 define lower boundaries of the openings 140 and the remaining portions 114b thereof are located under remaining portions of the third barrier material 138, as shown in FIG. 1J.

Referring to FIG. 1J, the openings 140 within the slot region 107 may horizontally (e.g., in the X-direction) neighbor the pillars 120 (shown in dashed lines) within the pillar array regions 109. For example, the openings 140 may be horizontally aligned in columns extending in the Y-direction within the slot region 107 (e.g., between neighboring blocks 137). In some embodiments, a single line of the openings 140 extends in the Y-direction within the extended slot 111" (FIG. 1H). In other words, the openings 140 are separated from one another in the Y-direction by the third barrier material 138, such that individual openings 140 do not overlap one another, and only one (e.g., a single) of the openings 140 horizontally separates the neighboring blocks 137 in the X-direction.

The openings 140 may have any suitable transverse cross-sectional shape such as, for example, a substantially circular cross-sectional shape or a substantially rectangular cross-sectional shape (e.g., a substantially square cross-sectional shape). The cross-sectional shape of support pillars 164 (see FIG. 1N) subsequently formed in the openings 140 may be tailored to provide sufficient mechanical support to the electronic device 100 without substantial conductivity loss of the electronic device 100. In some embodiments, each of the openings 140 may individually exhibit a substantially circular cross-sectional shape having a substantially circular cross-sectional area. In other embodiments, at least some of the openings 140 may individually exhibit an elongate cross-sectional shape, such as an oblong cross-sectional shape. While three openings 140 are shown in FIG. 1J for clarity, any number of the openings 140 may be formed within the slot region 107 and laterally adjacent to the pillars 120 within the pillar array regions 109 of the electronic device 100.

The openings 140 may have a horizontal dimension (e.g., diameter) $D_2$ within a range from about 100 nm to about 400 nm, such as from about 100 nm to about 150 nm, from about 150 nm to about 200 nm, from about 200 nm to about 250 nm, from about 250 nm to about 300 nm, from about 300 nm to about 350 nm, or from about 350 nm to about 400 nm. In some embodiments, the horizontal dimension $D_2$ is about 275 nm. However, the disclosure is not so limited and the horizontal dimension $D_2$ may be different than those described. In some embodiments, the horizontal dimension $D_2$ may be relatively larger than the horizontal dimension $D_1$. In other embodiments, the horizontal dimension $D_2$ may be substantially the same as or, alternatively, less than the horizontal dimension $D_1$. In some embodiments, a horizontal dimension (e.g., a width $W_2$ in the X-direction) of the etch stop material 114 may correspond to (e.g., may be substantially the same as) the horizontal dimension $D_2$ of the openings 140. The width $W_2$ in a first horizontal direction (e.g., the X-direction) may be relatively larger than the width $W_1$ of the first slot 111 (FIG. 1B) and, thus, the extended slot 111" (FIG. 1H) in the first horizontal direction. Accordingly, the horizontal dimension $D_2$ in the first horizontal direction may be relatively larger than the width $W_1$ in the first horizontal direction, substantially orthogonal to a second horizontal direction (e.g., the Y-direction) in which the extended slot 111" extends. In other embodiments, the width $W_2$ and, thus, the horizontal dimension $D_2$ may be substantially the same as or, alternatively, less than the width $W_1$.

In some embodiments, the openings 140 may initially be formed to have a smaller horizontal dimension, and thereafter (e.g., at the processing stage of FIG. 1L) the openings 140 may be enlarged to exhibit the horizontal dimension $D_2$. In embodiments including the horizontal dimension $D_2$ of the openings 140 being relatively larger than or substantially the same as the width $W_1$, the remaining portions 114b of the etch stop material 114 may be spaced apart from one another in at least one horizontal direction (e.g., the Y-direction). In other words, the remaining portions 114b of the etch stop material 114 may include discrete (e.g., discontinuous) portions in at least one horizontal direction. As used herein, the term "discrete" means and includes a material or structure that is defined by one or more differing materials or structures. For example, the openings 140 may segment individual remaining portions 114b of the etch stop material 114 from one another.

In embodiments including the horizontal dimension $D_2$ of the openings 140 being less than the width $W_1$, the remaining portions 114b of the etch stop material 114 may include a substantially continuous material, and the etch stop material 114 may substantially laterally surround (e.g., substantially continuously laterally surround) lower regions of the openings 140, as well as the support pillars formed therein. Further, the third barrier material 138 may include a substantially continuous material within the slot region 107, and the third barrier material 138 may substantially laterally surround (e.g., substantially continuously laterally surround) regions of the openings 140 at an elevational level above the etch stop material 114, as well as the support pillars subsequently formed therein.

A horizontal dimension $D_3$ (e.g., a distance in the Y-direction) between neighboring openings 140 (e.g., between an outer perimeter thereof) may be within a range from about 100 nm to about 2000 nm (e.g., 2 μm), such as from about 100 nm to about 500 nm, from about 500 nm to about 1000 nm, from about 1000 nm to about 1500 nm, or from about 1500 nm to about 2000 nm. In some embodiments, the horizontal dimension $D_3$ is about 1500 nm (e.g., 1.5 μm). However, the disclosure is not so limited and the horizontal dimension $D_3$ may be different than those described. For example, the horizontal dimension $D_3$ may be less than those described (e.g., less than 100 nm, less than 50 nm), so long as the openings 140 are separated by portions of the third barrier material 138 that are thick enough to withstand subsequent processing of the electronic device 100. In some embodiments, the horizontal dimension $D_3$ may be less than or equal to a horizontal dimension (e.g., a distance in the X-direction) of a respective block 137. Further, the horizontal dimension $D_3$ may be about three times (3×) greater than the horizontal dimension $D_2$ of the openings 140. In other words a ratio of the $D_3:D_2$ (e.g., a ratio of the distance between neighboring openings 140 to the diameter of the openings 140) is about 3:1. In some embodiments, the $D_3:D_2$ ratio is substantially even (e.g., 1:1). In other embodiments, the $D_3:D_2$ ratio is less than 1:1 (e.g., 1:2, 1:3, or 1:4). However, the disclosure is not so limited and the $D_3:D_2$ ratio may be different than those described. The $D_3:D_2$ ratio may be tailored to have a desired value between neighboring openings 140 to the diameter of the openings 140 that may be selected at least partially based on design requirements of the electronic device 100.

As shown in FIG. 1J, the additional openings 140' may be formed within the stack 101 prior to or, alternatively, during formation of the openings 140. The additional openings 140' may be formed around a perimeter (e.g., near lateral edges) of the pillar array regions 109, without being formed within the slot region 107. For example, the additional openings 140' may be formed within or proximate to the staircase structures (e.g., the staircase structure 220 (FIG. 2)) within the staircase region (e.g., the staircase region 221 (FIG. 2)) horizontally adjacent to the pillar array regions 109. Additionally, or alternatively, at least some of the additional openings 140' may be formed within central regions of individual blocks 137 of the stack 101 within one or more of the pillar array regions 109. For example, the additional openings 140' may be formed in one or more rows along a midline centrally located between neighboring slot regions 107, without being formed within the slot region 107. The additional openings 140' may be configured (e.g., sized and shaped) to be substantially the same as the openings 140 and may be formed during formation thereof. For example, a horizontal dimension (e.g., diameter) of the additional openings 140' may or may not be substantially the same as the horizontal dimension $D_2$ of the openings 140. By forming the additional openings 140' during formation of the openings 140, manufacturing costs may be reduced.

The additional openings 140' located external to the slot region 107 may be used to form additional support pillars (e.g., the additional support pillars 164' (FIG. 1O)). At least some of the additional support pillars may, for example, be configured to extend vertically (e.g., in the Z-direction) through the stack 101 and physically contact (e.g., land on) a structure within the source 102 to facilitate a predetermined function (e.g., an electrical interconnection function) in addition to providing a support function.

Figure 2:
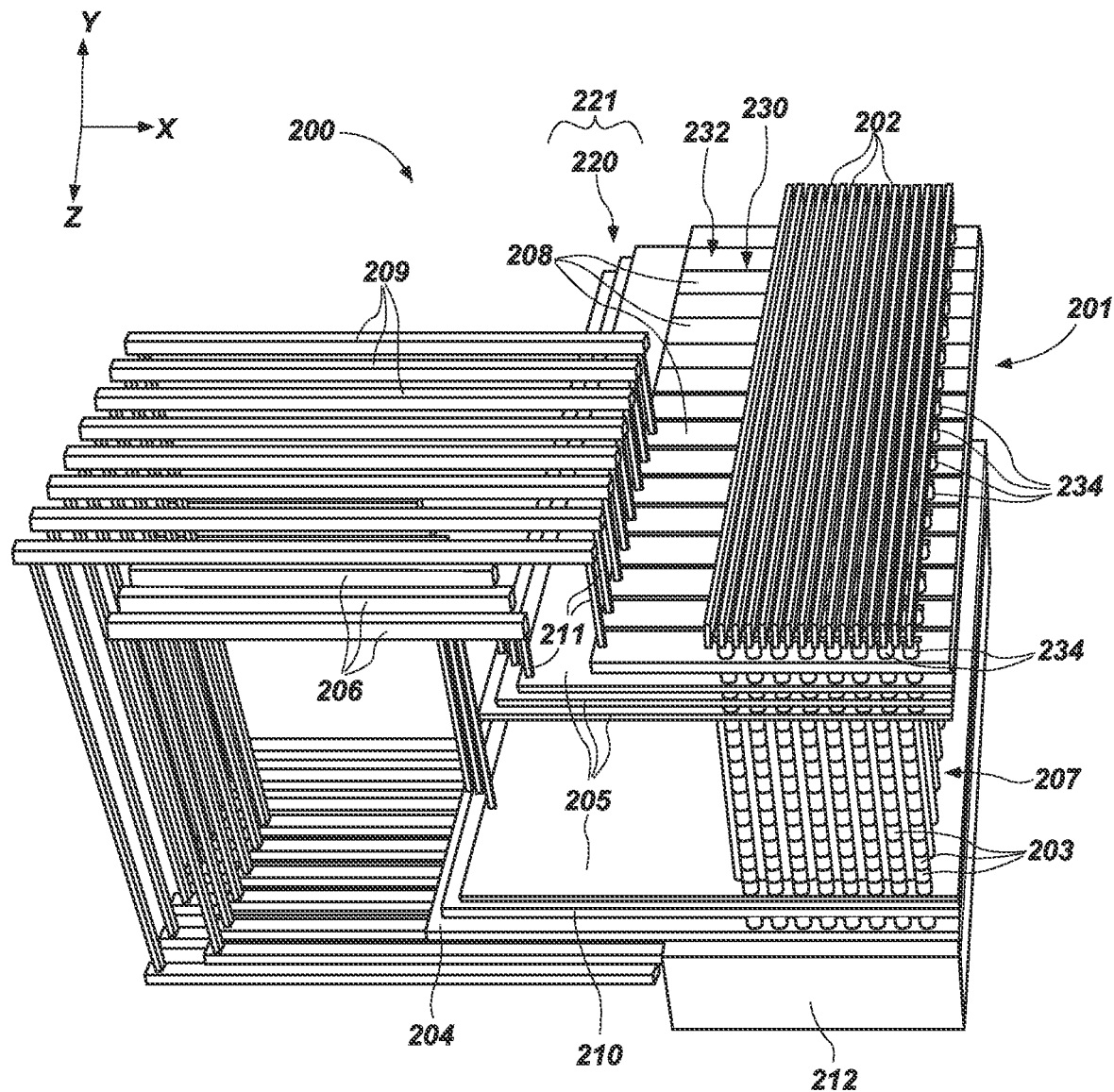
FIG. 2 is a partial cutaway perspective view of an electronic device, in accordance with embodiments of the disclosure.

Additionally, or alternatively, the additional support pillars formed within the additional openings 140' may be configured as support structures without providing electrical interconnection (e.g., to the source 102 (FIG. 1I)) and serve primarily (e.g., only) to provide mechanical support within one or more of the pillar array regions 109 and the staircase region 221 (FIG. 2). In some embodiments, at least some of the additional openings 140' are formed prior to formation of the openings 140 (e.g., during formation of the second pillar openings 110' (FIG. 1D), during formation of the extended slot 111" (FIG. 1H)). In some such embodiments, at least some of the additional openings 140' may be filled with the third barrier material 138 during formation of the third barrier material 138 within the extended slot 111" at the processing stage depicted in FIG. 1H. For example, the third barrier material 138 formed in the additional openings 140' may remain in the electronic device 100, without being removed and replaced with subsequently formed materials. In other words, the third barrier material 138 may remain in at least some of the additional openings 140' without serving as sacrificial structures. By forming the third barrier material 138 of the additional support pillars within the additional openings 140' during formation of the third barrier material 138 within the slot region 107, manufacturing costs may be reduced. Forming the third barrier material 138 in the additional openings 140' prior to formation of the conductive structures may provide enhanced structural support during formation of the conductive structures, which may further reduce or substantially prevent undesirable tier deformations and/or tier collapse during the formation of the conductive structures.

Referring to FIG. 1K, the sacrificial portions 114a (FIG. 1J) of the etch stop material 114 (FIG. 1J) may be selectively removed (e.g., exhumed) to expose the first barrier material 104, without exposing the source 102. In other embodiments, the source 102 may be exposed through the openings 140. The openings 140 (also referred to herein as "replacement gate openings") may facilitate replacement of the additional insulative structures 108 (FIG. 1I) to form conductive structures 144 through so-called "replacement gate" or "gate last" processing acts. Accordingly, the processing acts to replace the additional insulative structures 108 with the conductive structures 144 may be performed through segmented portions of the openings 140 (e.g., support pillar openings) rather than through conventional replacement gate slots (e.g., corresponding to the extended slot 111" (FIG. 1H)) as in conventional replacement gate processes. As described above, by providing the portions of the third barrier material 138 that remain within the slot region 107 during formation of the conductive structures 144, such configurations may, for example, reduce or substantially prevent undesirable tier deformations and/or tier collapse during the formation of the conductive structures 144.

The additional insulative structures 108 (FIG. 1I) may be selectively removed (e.g., exhumed) through the openings 140. In some embodiments, the additional insulative structures 108 are removed by exposing the additional insulative structures 108 to a so-called "wet nitride strip" comprising a wet etchant comprising phosphoric acid. Resulting spaces formed between vertically neighboring (e.g., in the Z-direction) insulative structures 106 may be filled with one or more conductive materials to form the conductive structures 144 and a stack 141 including tiers 142 of the insulative structures 106 and the conductive structures 144. The conductive structures 144 may be located at locations corresponding to the previous locations of the additional insulative structures 108 removed through the openings 140. In some embodiments, residual portions of the additional insulative structures 108 may be removed by subsequently exposing the insulative material thereof to additional wet etch and/or dry etch chemistries, for example, in one or more additional material removal processes prior to forming the conductive structures 144.

The conductive structures 144 may be formed of and include any conductive material including, but not limited to, n-doped polysilicon, p-doped polysilicon, undoped polysilicon, or a metal. In some embodiments, the conductive structures 144 comprise n-doped polysilicon. In other embodiments, the conductive structures 144 comprise tungsten. The conductive material of each of the conductive structures 144 may individually include a substantially homogeneous composition, or a substantially heterogeneous composition. In some embodiments, the conductive material of each of the conductive structures 144 of each of the tiers 142 of the stack 141 exhibits a substantially homogeneous composition. In additional embodiments, at least one of the conductive structures 144 of at least one of the tiers 142 of the stack 141 exhibits a substantially heterogeneous composition. The conductive structures 144 of each of the tiers 142 of the stack 141 may each be substantially planar, and may each exhibit a desired thickness.

Formation of the conductive structures 144 may form the strings 170 of the memory cells 172, each memory cell 172 located at an intersection of a conductive structure 144 and the memory cell materials (e.g., the dielectric blocking material 122, the charge blocking material 124, the memory material 126, and the tunnel dielectric material 128) and the channel material 130.

Although the electronic device 100 has been described and illustrated as comprising the memory cells 172 having a particular configuration, the disclosure is not so limited. In some embodiments, the memory cells 172 may comprise so-called "MONOS" (metal-oxide-nitride-oxide-semiconductor) memory cells. In additional embodiments, the memory cells 172 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In other embodiments, the memory cells 172 comprise so-called "floating gate" memory cells including floating gates (e.g., metallic floating gates) as charge storage structures. The floating gates may horizontally intervene between central structures of the strings 170 and the conductive structures 144.

At least one lower conductive structure 144 of the stack 141 may be employed as at least one lower select gate (e.g., at least one source side select gate (SGS)) of the electronic device 100. In some embodiments, a single (e.g., only one) conductive structure 144 of a vertically lowermost tier 142 of the stack 141 is employed as a lower select gate (e.g., a SGS) of the electronic device 100. In addition, upper conductive structure(s) 144 of the stack 141 may be employed as upper select gate(s) (e.g., drain side select gate(s) (SGDs)) of the electronic device 100. In some embodiments, horizontally-neighboring conductive structures 144 of a vertically uppermost tier 142 of the stack 141 (e.g., separated from each other by additional slot structures) are employed as upper select gates (e.g., SGDs) of the electronic device 100. In some embodiments, more than one (e.g., two, four, five, six) conductive structures 144 are employed as an upper select gate (e.g., a SGD) of the electronic device 100.

Formation of the conductive structures 144 may form conductive levels 145 vertically neighboring insulative levels 147 of the insulative structures 106 and vertically interposed between (vertically interleaved with) vertically neighboring insulative structures 106. In some embodiments, the conductive levels 145 are located within vertical boundaries defined by vertically neighboring insulative structures 106, and the insulative levels 147 are located within vertical boundaries defined by vertically neighboring conductive structures 144.

The remaining insulative structures 106 may extend laterally in a cantilever fashion and exhibit a relatively large aspect ratio (e.g., a ratio of a length of the insulative structures 106 (e.g., in the X-direction) to a thickness (e.g., in the Z-direction) thereof). A length of the insulative structures 106 between the pillars 120 and the openings 140 may be within a range from, for example, about 300 nm to about 350 nm, such as from about 300 nm to about 325 nm or from about 325 nm to about 350 nm. Of course, the disclosure is not so limited and the length may be different than those described. In some embodiments, the length is larger at lower portions of the stack 101 relative to other portions. Due to the large length relative to the thickness of insulative structures, the insulative structures of conventional electronic devices may be prone to failure and collapse. In addition, due to the larger length at the lower portions of the stack 101 (e.g., lower portions of the first deck 103) relative to other portions, the lowermost insulative structures 106 may be more prone to collapsing. However, since the third barrier material 138 extends substantially entirely through the stack 101 within the slot region 107 and is formed at an extreme edge of the insulative structures 106 immediately proximate the openings 140, the lowermost insulative structures 106 may be less prone to collapse compared to the insulative structures of conventional electronic devices.

Referring to FIG. 1L, after forming the conductive structures 144 of the conductive levels 145, portions thereof may, optionally, be removed through the openings 140 to form recessed regions 146. For example, the conductive structures 144 may be exposed to one or more etch chemistries to selectively remove a conductive material of the conductive structures 144 and any surrounding materials (e.g., a conductive liner material) through the openings 140. The one or more etch chemistries may include one or more wet etchants, one or more dry etchants, or both. In some embodiments, the conductive structures 144 are exposed to a wet etchant. Accordingly, exposed surfaces (e.g., side surfaces) of the conductive structures 144 may be horizontally recessed relative to exposed surfaces (e.g., side surfaces) of the insulative structures 106 of the insulative levels 147 proximate the openings 140.

Formation of the recessed regions 146 may facilitate formation of additional conductive structures (e.g., additional conductive material, conductive rails) formed horizontally adjacent (e.g., horizontally on) at least some of the conductive structures 144 of the conductive levels 145. Since the openings 140 occupy regions proximate to horizontal ends of the conductive structures 144, the electrical resistance exhibited by the conductive structures 144 of the tiers 142 of FIG. 1L may be greater than desired. To lower the electrical resistance, the additional conductive structures may be formed to extend (e.g., laterally extend) from the exposed surfaces of the conductive structures 144 within the openings 140. In other embodiments, the recessed regions 146 may be filled with one or more insulative materials.

In additional embodiments, the conductive structures 144 may not be recessed relative to the exposed surfaces of the insulative structures 106, such that the recessed regions 146 are not formed in the electronic device 100. Rather, residual portions of the conductive material of the conductive structures 144 within the openings 140 may be removed (e.g., etched) to isolate the conductive structures 144 (e.g., access lines, word lines) without recessing the conductive structures 144 relative to the insulative structures 106. Further, in embodiments including the openings 140 being initially formed to have a smaller horizontal dimension at the processing stage of FIGS. 1I and 1J, the openings 140 may be enlarged at the processing stage of FIG. 1L, for example, to exhibit the horizontal dimension $D_2$ (See FIG. 1J). In some such embodiments, exposed surfaces of each of the first barrier material 104, the insulative structures 106, the conductive structures 144, the upper insulative material 116, and the second barrier material 118 are recessed (e.g., substantially equally recessed) to enlarge the openings 140.

Referring to FIG. 1M, following formation of the conductive structures 144 through the openings 140, one or more of the insulative structures 106 (FIG. 1L) and the upper insulative material 116 (FIG. 1L) may, optionally, be selectively removed (e.g., exhumed) through the openings 140. The insulative structures 106 and the upper insulative material 116 may be removed by exposing the respective materials to wet etch and/or dry etch chemistries, for example, in one or more material removal processes. Accordingly, lateral openings 148 may be formed between vertically neighboring (e.g., in the Z-direction) conductive structures 144 within the stack 141, and an additional lateral opening 150 may be formed between an uppermost one of the conductive structures 144 and the second barrier material 118. The lateral openings 148 may be located at locations corresponding to the previous locations of the insulative structures 106 removed through the openings 140, and the additional lateral opening 150 may be located at a location corresponding to the location of the upper insulative material 116 removed through the openings 140. In some embodiments, entire portions of at least some (e.g., each) of the insulative structures 106 and the upper insulative material 116 may be removed (e.g., substantially entirely removed). In some such embodiments, residual portions of the insulative structures 106 and/or the upper insulative material 116 may be removed through the openings 140 by subsequently exposing the insulative materials thereof to additional wet etch and/or dry etch chemistries, for example, in one or more additional material removal processes. In other embodiments, at least portions of the insulative structures 106 and/or the upper insulative material 116 may remain in the lateral openings 148 and the additional lateral opening 150, respectively. Additional process acts (e.g., material removal process acts) may be performed to electrically isolate the memory cells 172.

As shown in FIG. 1M, after forming the lateral openings 148 and the additional lateral opening 150, a liner material 152 may be formed within the openings 140. In some embodiments, the liner material 152 is formed adjacent to (e.g., directly laterally adjacent to) side surfaces of the second barrier material 118 and the conductive structures 144 exposed within the openings 140. After forming the liner material 152, the electronic device 100 may be exposed to a chemical mechanical planarization (CMP) process to remove additional material outside of the openings 140 and to isolate individual portions thereof.

The liner material 152 may be formed of and include at least one dielectric material having a lower dielectric constant (K) than a silicon nitride ($Si_3N_4$) material. By way of non-limiting example, the liner material 152 may comprise one or more of silicon oxycarbide ($SiO_xC_y$), silicon oxynitride ($SiO_xN_y$), hydrogenated silicon oxycarbide ($SiC_xO_yH_z$), and silicon oxycarbonitride ($SiO_xC_yN_z$). In some embodiments, the liner material 152 comprises $SiO_xC_yN_z$. In additional embodiments, a different dielectric material (e.g., an oxide material, such as a dielectric oxide material, having a dielectric constant lower than the dielectric constant of a silicon oxide ($SiO_x$, $SiO_2$) material or of a carbon-doped silicon oxide material that includes silicon atoms, carbon atoms, oxygen atoms, and hydrogen atoms) may be employed as the liner material 152. In some embodiments, the liner material 152 may function as an insulator having a dielectric constant (K) within a range of from about 1.9 to about 3.2, such as within a range of from about 1.9 to about 2.7, from about 2.7 to about 3.0, or from about 3.0 to about 3.2. In some embodiments, the dielectric constant (K) of the liner material 152 is about 3.0.

For example, the liner material 152 may be formed of and include a so-called "low-K dielectric material." As used herein, the term "low-K dielectric material" means and includes a dielectric material, such as a dielectric nitride material or a dielectric oxide material, having a dielectric constant (K) lower than the dielectric constant of a silicon nitride ($Si_3N_4$) material, of a silicon oxide ($SiO_x$, $SiO_2$) material, or of a carbon-doped silicon oxide material that includes silicon atoms, carbon atoms, oxygen atoms, and hydrogen atoms. The dielectric constant of silicon dioxide is from about 3.7 to about 3.9 and the dielectric constant of silicon nitride is about 7.5. The term "low-K dielectric material" is a relative term and is distinguished from the term "dielectric material" by a relative value of its dielectric constant. In some embodiments, the liner material 152 is formed of and includes a low-K dielectric material. In other embodiments, the liner material 152 comprises silicon dioxide. Further, a material composition of the liner material 152 may be the same as, or different than, a material composition of the insulative structures 106 (FIG. 1L).

With continued reference to FIG. 1M, one or more air gaps 154 (e.g., voids, unfilled volumes) may be formed in the lateral openings 148 in place of one or more of the insulative structures 106 (FIG. 1L) of the insulative levels 147. Further, an additional air gap 156 may be formed in the additional lateral opening 150 in place of the upper insulative material 116 (FIG. 1L). Accordingly, at least some of the air gaps 154 and the additional air gap 156 may be laterally interposed between portions of the liner material 152 and the pillars 120 (e.g., the dielectric blocking material 122 thereof). The pillars 120 within individual blocks 137 may be horizontally separated from one another by the air gaps 154 and the additional air gap 156. The air gaps 154 may be in direct vertical alignment with the conductive structures 144 and located within horizontal boundaries thereof. In some embodiments, lateral side boundaries of the air gaps 154 are substantially vertically aligned with lateral side surfaces of at least some of the conductive structures 144. Upper boundaries of the additional air gap 156 may be vertically aligned with or, alternatively, vertically below upper surfaces of one or more of the pillars 120 and the conductive contact structures 135.

The insulative structures 106 and the upper insulative material 116 may be replaced (e.g., substantially replaced) with or, alternatively, supplemented with the air gaps 154 and the additional air gap 156, respectively. For example, the insulative levels 147 may be substantially devoid (e.g., substantially absent) of an insulative material (e.g., an oxide material) within horizontal boundaries of the conductive structures 144. In some embodiments, at least some of the air gaps 154 and the additional air gap 156 include a gaseous material (e.g., air, oxygen, nitrogen, argon, helium, or a combination thereof). In other embodiments, the air gaps 154 and the additional air gap 156 include a vacuum (e.g., a space entirely void of matter).

The liner material 152 may be formed within the lateral openings 148 and the additional lateral opening 150 to effectively "pinch off" and close (e.g., seal) the lateral openings 148 and the additional lateral opening 150 immediately adjacent to the openings 140 resulting in formation of the air gaps 154 and the additional air gap 156. The liner material 152 may be formed to vertically extend between neighboring conductive structures 144 within the lateral openings 148 of the insulative levels 147, such that the liner material 152 substantially completely vertically fills outermost portions of the lateral openings 148 proximate the openings 140 without entirely filling the lateral openings 148. Similarly, the liner material 152 may be formed to vertically extend between the uppermost one of the conductive structures 144 and the second barrier material 118 within the additional lateral opening 150, such that the liner material 152 substantially completely vertically fills an outermost portion of the additional lateral opening 150 proximate the openings 140 without entirely filling the additional lateral opening 150.

Formation of the liner material 152 may result in formation of so-called "bread loafing" regions of the liner material 152 within the lateral openings 148 and the additional lateral opening 150. Accordingly, formation of the liner material 152 through the openings 140 may usefully result in the bread loafing regions being present between the openings 140 and the horizontally neighboring pillars 120. In other words, process acts may be selected to provide (e.g., facilitate, promote) the bread loafing regions of the liner material 152 proximate the openings 140 for formation of the air gaps 154 and the additional air gap 156 between the openings 140 and the horizontally neighboring pillars 120. In some embodiments, additional materials (e.g., additional portions of the liner material 152) may be formed within the outermost portions of the lateral openings 148 and the additional lateral opening 150 to effectively "pinch off" and close the lateral openings 148 and the additional lateral opening 150 at lateral edges of the stack 141 to form the air gaps 154 and the additional air gap 156. Formation of the additional materials may or may not result in bread loafing regions thereof being present between the lateral edges of the stack 141 and the pillars 120.

The air gaps 154 and the additional air gap 156 may be located distal from the openings 140 and proximate (e.g., directly laterally adjacent) to the pillars 120. The pillars 120 may be substantially surrounded by the additional air gap 156 at an elevational level of the conductive contact structures 135. The air gaps 154 may be located within the insulative levels 147 and may be defined by the liner material 152, the pillars 120, and the conductive structures 144. The additional air gap 156 may be defined by the liner material 152, the pillars 120, the uppermost one of the conductive structures 144, and the second barrier material 118. A lateral side boundary of the air gaps 154 may be substantially vertically aligned with a lateral side surface of at least some of the conductive structures 144 proximate the pillars 120. Elongated portions of the air gaps 154 may extend in at least one horizontal direction (e.g., the X-direction, the Y-direction) with at least a portion of the air gaps 154 being located directly adjacent to the dielectric blocking material 122 of the pillars 120. In some embodiments, the air gaps 154 exhibit a substantially rectangular profile in at least one horizontal direction (e.g., the X-direction) and extending substantially parallel to a major surface of the source 102. In some embodiments, the air gaps 154 include laterally extending volumes between the vertically neighboring conductive structures 144, such that a single (e.g., one) air gap 154 is within a single, undivided space at each of the tiers 142 of the stack 141.

As shown in FIG. 1M, the air gaps 154 may be formed to have a desired height $H_1$, and the additional air gap 156 may be formed to have a height $H_2$ that is relatively greater than the height $H_1$ of the air gaps 154. By way of non-limiting example, the height $H_1$ of the air gaps 154, may be within a range of from about 10 nm to about 40 nm, such as from about 10 nm to about 20 nm, from about 20 nm to about 30 nm, or from about 30 nm to about 40 nm. The height $H_2$ of the additional air gap 156, may be within a range of from about 20 nm to about 60 nm, such as from about 20 nm to about 30 nm, from about 30 nm to about 40 nm, from about 40 nm to about 50 nm, or from about 50 nm to about 60 nm. The height $H_2$ of the additional air gap 156 may be relatively larger than the height of one of the conductive structures 144 and relative larger than a combined height of the air gaps 154 and one of the conductive structures 144 of one of the tiers 142. In addition, the liner material 152 may be formed to any desired thickness, such as a thickness less than or equal to about 60 nm, such as within a range of from about 20 nm to about 30 nm, from about 30 nm to about 40 nm, from about 40 nm to about 50 nm, or from about 50 nm to about 60 nm. In some embodiments, one or more additional materials (e.g., a cap material, a nitride material) may be formed adjacent to the liner material 152 within or proximate the additional lateral opening 150 to facilitate uniform coverage of the relatively larger height $H_2$ of the additional air gap 156 within the additional lateral opening 150. Forming the electronic device 100 to include the liner material 152, the air gaps 154, and the additional air gap 156 may facilitate improved performance of the electronic device 100.

In some embodiments, the air gaps 154 and the additional air gap 156 may function as an insulator having a dielectric constant (K) of about 1. Further, the air gaps 154 and the additional air gap 156 may improve performance of the electronic device 100 by providing improved insulative properties laterally adjacent to the pillars 120, through decreased dielectric constant relative to the insulative structures 106 (FIG. 1L) and the upper insulative material 116 (FIG. 1L). The air gaps 154 may limit capacitance (e.g., parasitic capacitance, stray capacitance) between the vertically neighboring conductive structures 144, and may reduce cross-talk therebetween. The additional air gap 156 may further limit capacitance between the uppermost one of the conductive structures 144 and the conductive contact structures 135 of the pillars 120, and may reduce cross-talk therebetween. For example, the additional air gap 156 may be configured (e.g., sized, shaped) to reduce parasitic (e.g., stray) capacitance between lateral portions of the uppermost one of the conductive structures 144 proximate the pillars 120 and the conductive contact structures 135.

For example, the liner material 152, the air gaps 154, and the additional air gap 156, according to embodiments of the disclosure may reduce bridging and/or parasitic capacitance between the conductive structures 144 and between the conductive contact structures 135 and the uppermost one of the conductive structures 144 relative to configurations wherein the liner material 152 and the air gaps 154 are not present. The reduced capacitance may, in turn, provide a reduced programming time, in some instances. The liner material 152 laterally adjacent to the pillars 120 may allow for reduced parasitic capacitance between neighboring conductive structures 144, without the need to increase a thickness of such insulating structures of the insulative levels 147. Presence of the additional air gap 156 proximate to the pillars 120 and laterally adjacent to the liner material 152 also allows for reduced parasitic capacitance between the conductive contact structures 135 and the uppermost one of the conductive structures 144. By lowering parasitic capacitance between adjacent structures using the air gaps 154 and the additional air gap 156, bridging and/or parasitic capacitance of the associated structures may be further reduced within the electronic device 100. As a result, the RC (product of resistance and capacitance) of the conductive structures may be optimized, which may correlate to an increase in the performance of an apparatus containing the electronic device 100 by allowing for a reduction in operational speed (e.g., programming time). Furthermore, the methods of the disclosure may reduce or eliminate process acts utilized to form many conventional electronic devices that may be used for similar operations as the electronic device 100. Accordingly, the electronic device 100 according to embodiments of the disclosure may be formed utilizing fewer process acts than conventional electronic devices.

In contrast, conventional configurations including an insulative material (e.g., an oxide material) laterally adjacent to pillar structures corresponding to the pillars 120 may have a dielectric constant of about 3.7 or greater. Accordingly, a portion of an uppermost conductive structure (e.g., corresponding to the uppermost conductive structure) of a conventional configuration may be susceptible to electrical contact (e.g., bridging) with conductive contact structures (e.g., corresponding to the conductive contact structures 135) and/or with conductive lines during subsequent process acts, as well as during use and operation of the conventional electronic devices including such conventional configuration.

Referring to FIGS. 1N and 1O, after forming the air gaps 154 and the additional air gap 156 using the liner material 152, additional conductive structures may be formed adjacent to (e.g., on or over) the pillars 120, and the support pillars 164 may be formed within the openings 140 (FIG. 1M). FIG. 1N is a simplified cross-sectional view of the electronic device 100 taken along the N-N line of FIG. 1O, which is a simplified top-down view of the electronic device 100. FIG. 1P illustrates an enlarged portion of box 172 of FIG. 1N and illustrates a memory cell 172, in accordance with embodiments of the disclosure. With reference to FIGS. 1N and 1O, in some embodiments, a so-called "punch through" etch may be performed to remove portions of the liner material 152 and to expose the underlying portions of the first barrier material 104, and portions of the first barrier material 104 thereunder may be selectively removed (e.g., exhumed) to expose the underlying source 102. In other embodiments, portions of the liner material 152 and the first barrier material 104 may remain between the source 102 and the support pillars 164, such as when electrical interconnection is not provided therebetween. In addition, remaining portions of one or more of the additional etch stop material 115 (FIG. 1D) and the first barrier material 104 underlying the pillars 120, if present, may be removed to expose the source 102, and electrical interconnection may be provided between the channel material 130 of the pillars 120 and the source 102.

Portions of the second barrier material 118 (e.g., the additional portions thereof) overlying the conductive contact structures 135 may be selectively removed to form contact openings 158 therein and to expose the conductive contact structures 135. Conductive contacts 160 (e.g., contacts, pillar contacts) may be formed in the contact openings 158 extending vertically through the second barrier material 118. For example, a conductive material may be formed (e.g., deposited) into the contact openings 158, and excess portions of the conductive material may be removed (e.g., through a CMP process) to form the conductive contacts 160. The conductive contacts 160 may be formed of and include at least one conductive material. In some embodiments, the conductive contacts 160 are formed of and include one or more of tungsten, titanium, and titanium nitride.

The conductive contacts 160 may be adjacent to (e.g., vertically adjacent to, on) and in direct electrical contact with the conductive contact structures 135. In some embodiments, the conductive contacts 160 may be formed to horizontally extend over an entire exposed surface of the conductive contact structures 135, as shown in FIG. 1N. In other embodiments, the conductive contacts 160 may be formed to horizontally extend over only a portion of the exposed surface of the conductive contact structures 135. Following formation of the conductive contacts 160, interconnect structures (e.g., filled contact vias, filled bit line vias) may, optionally, be formed adjacent to (e.g., on or over) the upper surfaces of the conductive contacts 160, and conductive lines (e.g., data lines 202 (FIG. 2)) may be formed thereover. For simplicity, the interconnect structures are not shown in FIG. 1N.

With continued reference to FIGS. 1N and 1O, a fill material 162 of the support pillars 164 may be formed adjacent (e.g., over) the liner material 152, substantially filling the openings 140 (FIG. 1M). In some embodiments, the fill material 162 is formed of and includes an insulative material, such as a silicon oxide material. In other embodiments, the fill material 162 is formed of and includes at least one conductive material including, but not limited to, n-doped polysilicon, p-doped polysilicon, undoped polysilicon, or at least one other conductive material, such as one or more of tungsten, titanium, and titanium nitride. The liner material 152 may substantially surround sidewalls of the fill material 162.

The fill material 162 of the support pillars 164 may be formed to substantially fill remaining portions of the openings 140 (FIG. 1M) extending vertically through the first deck 103 and the second deck 105 of the stack 141 and to the source 102. The support pillars 164 may be within or proximate to the slot region 107 between the blocks 137 and may be confined within the slot region 107 of the electronic device 100. At least some of the support pillars 164 (e.g., including the insulative material) may be formed to extend vertically from an upper surface of the second barrier material 118 overlying the second deck 105 to an upper surface of the source 102. Alternatively or additionally, at least some of the support pillars 164 (e.g., including the conductive material as the fill material 162) may be formed to extend below the upper surface of the source 102 and into portions thereof (shown in dashed lines). For example, some of the support pillars 164 may be configured to extend vertically (e.g., in the Z-direction) through the stack 141 and physically contact (e.g., land on) a structure within the source 102 to facilitate a predetermined function (e.g., an electrical interconnection function, a support function) of the support pillars 164. Accordingly, at least portions of the support pillars 164 (e.g., the fill material 162) may extend to a lower depth than a depth to which the third barrier material 138 extends. In some embodiments, each of the support pillars 164 functions as active support pillars and is configured to provide electrical interconnection within the electronic device 100. In other embodiments, at least some of the support pillars 164 do not provide electrical interconnection and serve primarily (e.g., only) to provide mechanical support. The number of active support pillars and mechanical support (e.g., dummy) pillars may be determined, at least in part, on the number of support pillars 164 provided, as well as the spacing (e.g., the horizontal dimension $D_3$ (FIG. 1J)) therebetween.

In some embodiments, such as when the fill material 162 of the support pillars 164 includes a conductive material, the fill material 162 may be formed during formation of the conductive contacts 160. By forming the fill material 162 of the support pillars 164 during formation of the conductive contacts 160, manufacturing costs may be reduced. After forming the fill material 162, the electronic device 100 may be exposed to a chemical mechanical planarization (CMP) process to remove additional material outside of the openings 140 (FIG. 1M) and to isolate individual portions thereof. Upper surfaces of each of the support pillars 164, the conductive contacts 160, and the second barrier material 118 may be substantially coplanar with one another.

The second barrier material 118 may substantially surround sidewalls of the liner material 152 of the support pillars 164 at an elevational level of one or more of the conductive contacts 160 and the conductive contact structures 135, as shown in FIG. 1O. Further, portions of the third barrier material 138 that remain within the slot region 107 may at least partially laterally surround the support pillars 164 and be in direct contact with the sidewalls of the liner material 152 of the support pillars 164. In some embodiments, the third barrier material 138 may substantially continuously laterally surround at least some (e.g., each) of the support pillars 164. Accordingly, the support pillars 164 are laterally separated from one another by the third barrier material 138 along a vertical height of the support pillars 164. In some embodiments, a single line of the support pillars 164 extends in the Y-direction within the extended slot 111" (FIG. 1H), such that only one (e.g., a single) of the support pillars 164 horizontally separates the neighboring blocks 137 in the X-direction. Further, the support pillars 164 are separated from one another in the Y-direction by the third barrier material 138, such that individual support pillars 164 do not overlap one another. Accordingly, each of the support pillars 164 is discrete (e.g., discontinuous) from each other of the support pillars 164 with portions of the third barrier material 138 extending therebetween. Further, individual portions of the fill material 162 of respective support pillars 164 are separated from one another by the liner material 152 and the third barrier material 138, such that the fill material 162 is discontinuous along the extended slot 111".

As shown in FIGS. 1N and 1O, formation of the support pillars 164 (e.g., the liner material 152 and the fill material 162) within the slot region 107 may result in formation of slot structures 165. The slot structures 165 may include the remaining portions 114b of the etch stop material 114, the remaining portions of the third barrier material 138, as well as the liner material 152 and the fill material 162 of the support pillars 164. In other words, each of the remaining portions 114b of the etch stop material 114, the remaining portions of the third barrier material 138, and the support pillars 164 (e.g., the liner material 152 and the fill material 162) define the slot structures 165. Thus, the blocks 137 of the pillar array regions 109 are separated from one another by the slot structures 165 within the slot region 107, which slot structures 165 include multiple (e.g., two or more) materials and structures including differing material compositions from one another. Accordingly, the materials of the slot structures 165 within the slot region 107 of the electronic device 100 may include additional materials and structures than that of conventional slot structures of conventional electronic devices. The additional materials (e.g., the third barrier material 138) and structures (e.g., the support pillars 164) relative to that of conventional slot structures may, for example, reduce or substantially prevent undesirable tier deformations (e.g., tier warping) and/or tier collapse during the formation of the conductive structures. The additional materials and structures, in turn, may substantially prevent the risk of undesirable current leakage and short circuits during use and operation of the electronic device 100 without significantly affecting conductivity.

The electronic device 100 may further include at least one control unit 174 (e.g., control device) underlying the stack 141. For example, the control unit 174 may be positioned under the source 102. The control unit 174 may include devices and circuitry for controlling various operations of other components of the electronic device 100. By way of non-limiting example, the control unit 174 may include one or more (e.g., each) of charge pumps (e.g., $V_{CCP}$ charge pumps, $V_{NEGWL}$ charge pumps, DVC2 charge pumps); delay-locked loop (DLL) circuitry (e.g., ring oscillators); drain supply voltage ($V_{dd}$) regulators; devices and circuitry for controlling column operations for arrays (e.g., arrays of vertical memory strings) to subsequently be formed within the electronic device 100, such as one or more (e.g., each) of decoders (e.g., column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices; and devices and circuitry for controlling row operations for arrays (e.g., arrays of the strings 170) within memory regions of the electronic device 100, such as one or more (e.g., each) of decoders (e.g., row decoders), drivers (e.g., word line (WL) drivers), repair circuitry (e.g., row repair circuitry), memory test devices, MUX, ECC devices, and self-refresh/wear leveling devices. In some embodiments, the control unit 174 includes CMOS (complementary metal-oxide-semiconductor) circuitry. In such embodiments, the control unit 174 may be characterized as having a "CMOS under Array" ("CuA") configuration.

As shown in FIG. 1N, the control unit 174 may include circuitry 178 in electrical communication with one or more of the source 102 and the fill material 162 of the support pillars 164. Contacts 176 (e.g., conductive contacts) may, optionally, electrically connect the circuitry 178 of the control unit 174 and the fill material 162 of the support pillars 164. For example, the contacts 176 may extend through a portion of insulative materials of the source 102 and, optionally, through a portion of the first barrier material 104, if present in the slot region 107, to provide electrical connection between the support pillars 164 and the circuitry 178, although other configurations of connections therebetween may be contemplated. For example, the fill material 162 of the support pillars 164 may directly contact a structure within the source 102.

With reference to FIG. 1O, in some embodiments, the remaining portions 114b of the etch stop material 114 may be spaced apart from one another in at least one horizontal direction (e.g., the Y-direction). In some such embodiments, the support pillars 164 segment individual remaining portions 114b of the etch stop material 114 from one another, as described above with reference to FIG. 1J. In other embodiments, the remaining portions 114b of the etch stop material 114 may include a substantially continuous material, and the etch stop material 114 may substantially laterally surround (e.g., substantially continuously laterally surround) lower portions of the support pillars 164.

The additional support pillars 164' may be formed within the additional openings 140' (FIG. 1J) within the stack 141 prior to or, alternatively, during formation of the support pillars 164. For example, the fill material 162 of the support pillars 164 and the additional support pillars 164' may be formed in a single processing act. The additional support pillars 164' may be formed around a perimeter (e.g., near lateral edges) of the pillar array regions 109, without being formed within the slot region 107, as described in further detail above. At least some of the additional support pillars 164' may, for example, be configured to extend vertically (e.g., in the Z-direction) through the stack 141 and physically contact a structure (e.g., the contacts 176) within the source 102 to facilitate a predetermined function (e.g., an electrical interconnection function) in addition to providing a support function. Additionally, or alternatively, the additional support pillars 164' including the third barrier material 138, for example, may be configured as support structures without providing electrical interconnection and serve primarily (e.g., only) to provide mechanical support within one or more of the pillar array regions 109 and the staircase region 221 (FIG. 2).

As shown in FIG. 1O, the neighboring blocks 137 may be horizontally separated (e.g., in the X-direction) from one another by the support pillars 164 of the slot structures 165 within the slot region 107. The horizontal dimension $D_2$ of the support pillars 164 in the first horizontal direction (e.g., the X-direction) may be relatively larger than the width $W_1$ of the extended slot 111" (FIG. 1H) in the first horizontal direction, substantially orthogonal to the second horizontal direction (e.g., the Y-direction) in which the extended slot 111" extends. By providing the third barrier material 138 and the support pillars 164 within the slot structures 165, the support pillars 164 may provide enhanced structural support to the stack 141 to facilitate formation of the air gaps 154 and the additional air gap 156.

Accordingly, the stack 141 of the electronic device 100 may include the third barrier material 138 of the slot structures 165 within the slot region 107 and horizontally proximate to the pillars 120 within the pillar array regions 109. In addition, the support pillars 164 of the slot structures 165 may be positioned within the slot region 107 and configured (e.g., sized and shaped) to inhibit (e.g., prevent) undesirable tier deformations (e.g., tier warping) and/or tier collapse. For example, the support pillars 164, in combination with the third barrier material 138, of the slot structures 165 within the slot region 107 may provide increased structural support at locations horizontally proximate to the horizontal ends (e.g., horizontal boundaries in the X-direction) of large cantilever structures of the insulative structures 106 (FIG. 1L) of the insulative levels 147 during replacement gate processing acts. In other words, formation of the third barrier material 138 within the slot region 107 facilitates formation of the openings 140 (FIG. 1M) within the slot region 107 prior to performing replacement gate processing acts, such that the additional insulative structures 108 (FIG. 1I) may be replaced with the conductive structures 144 through the openings 140. The support pillars 164 and the third barrier material 138 may also provide structural support to the conductive structures 144 to facilitate formation of the air gaps 154 and the additional air gap 156.

The configuration of the support pillars 164 and the third barrier material 138 of the slot structures 165 within the slot region 107 may substantially reduce or substantially prevent the risk of undesirable current leakage and short circuits in the stack 141 during use and operation of the electronic device 100, compared to conventional electronic devices lacking the support structures, without significantly affecting conductivity of the conductive structures 144. For example, the material of the third barrier material 138 may be selectively etchable relative to the material of one or more of the insulative structures 106 (FIG. 1L) and the additional insulative structures 108 (FIG. 1I) to minimize (e.g., prevent) loss of material thereof during subsequent process acts.

In contrast, conventional electronic devices may exhibit differential stress (e.g., differing compressive stress) on adjacent structures as a result of local stresses existing in large cantilever structures (e.g., insulative structures of tiers) in the bottom of a conductive stack. In addition, conventional electronic devices may exhibit wafer bow as a result of differing lengths among the insulative structures due to tapering of adjacent structures (e.g., pillars, staircase structures) at differing elevations of the conductive stack. The local stresses on adjacent structures and the wafer bow may result in contact misalignment (e.g., misalignment between conductive contacts and conductive structures of the tiers). By way of contrast, the support pillars 164 and the third barrier material 138 of the slot structures 165 within the slot region 107 according to embodiments of the disclosure may provide additional mechanical support at horizontal ends of the cantilever structures compared to only providing conventional support pillars within the pillar array regions.

In some instances, damage may occur to conventional support pillars during formation of conventional slots. Particularly, damage to the materials of the support pillars, also called "clipping," may be a source of defects, which can adversely affect electronic device performance. Accordingly, the support pillars 164 may be formed within the slot region 107 following formation of the extended slot 111" (FIG. 1H) in order to substantially reduce (e.g., substantially prevent) damage to the support pillars 164 during fabrication. Further, formation of the support pillars 164 within the slot region 107 may provide increased structural support within the stack 141, without undesirably increasing the overall width (e.g., horizontal footprint) of the stack 141 within the pillar array regions 109. For example, providing the support pillars 164 (e.g., active support structures, mechanical support structures) within the slot region 107 may reduce a number of support structures (e.g., the additional support pillars 164') within the pillar array regions 109 and the staircase region 221 (FIG. 2), which facilitates a greater cross-sectional area for formation of the conductive structures 144 of the stack 141.

FIG. 1P illustrates an enlarged portion of box 172 of FIG. 1N and illustrates a memory cell 172, in accordance with embodiments of the disclosure. With reference to FIG. 1P, the memory cells 172 may each include the channel material 130 horizontally neighboring the insulative material 132, the tunnel dielectric material 128 horizontally neighboring the channel material 130, the memory material 126 horizontally neighboring the tunnel dielectric material 128, the charge blocking material 124 horizontally neighboring the memory material 126, the dielectric blocking material 122 horizontally neighboring the charge blocking material 124, and the conductive structures 144 horizontally neighboring the dielectric blocking material 122.

In some embodiments, and as illustrated in FIG. 1P, a dielectric barrier material 166 may, optionally, be formed directly neighboring the dielectric blocking material 122 or, alternatively, the charge blocking material 124 and directly neighboring the air gaps 154 of the tiers 142. A conductive liner material 168 may directly neighbor the dielectric barrier material 166 and the conductive structures 144, in some embodiments. For example, the dielectric barrier material 166 may initially be formed directly adjacent to the dielectric blocking material 122, if present, or the charge blocking material 124 and the insulative structures 106 (FIG. 1L). The conductive liner material 168 may be formed directly adjacent to the dielectric barrier material 166 prior to formation of the air gaps 154 in spaces previously occupied by the insulative structures 106. In embodiments including the dielectric blocking material 122 of the pillars 120, the dielectric barrier material 166 may not be present. For ease of illustration and understanding, the dielectric barrier material 166 and the conductive liner material 168 are not illustrated in FIG. 1N, but it will be understood that the electronic device 100 may include one or both of the dielectric barrier material 166 and the conductive liner material 168.

The dielectric barrier material 166 may be formed of and include one or more of a metal oxide (e.g., one or more of aluminum oxide, hafnium oxide, zirconium oxide, lanthanum oxide, yttrium oxide, tantalum oxide, gadolinium oxide, niobium oxide, titanium oxide), a dielectric silicide (e.g., aluminum silicide, hafnium silicide, zirconium silicate, lanthanum silicide, yttrium silicide, tantalum silicide), and a dielectric nitride (e.g., aluminum nitride, hafnium nitride, lanthanum nitride, yttrium nitride, tantalum nitride). In some embodiments, the dielectric barrier material 166 comprises aluminum oxide.

The conductive liner material 168 may be formed of and include a seed material from which the conductive structures 144 may be formed. The conductive liner material 168 may be formed of and include, for example, a metal (e.g., titanium, tantalum), a metal nitride (e.g., tungsten nitride, titanium nitride, tantalum nitride), or another material. In some embodiments, the conductive liner material 168 comprises titanium nitride. In other embodiments, the dielectric barrier material 166 is in direct contact with each of the conductive structures 144 and the electronic device 100 is substantially (e.g., entirely) devoid of the conductive liner material 168 between the dielectric barrier material 166 and the conductive structures 144. In other words, each of the tiers 142 lack a titanium nitride material between the air gap 154 and the conductive structures 144, in some embodiments.

Accordingly, in some embodiments, an electronic device comprises a stack comprising tiers of alternating conductive levels and insulative levels overlying a source, slots extending vertically through the stack and dividing the stack into blocks, and support pillars within the slots and extending vertically through the stack. The support pillars exhibit a lateral dimension in a first horizontal direction relatively larger than a lateral dimension of the slots in the first horizontal direction, substantially orthogonal to a second horizontal direction in which the slots extend.

Accordingly, in at least some embodiments, a method of forming an electronic device comprises forming pillars in a stack comprising alternating first materials and second materials within an array region. The stack overlies a source. The method comprises forming slots extending vertically through the stack and dividing the stack into blocks, forming a barrier material within the slots, and forming support pillar openings through the barrier material. The method comprises replacing the first materials of the stack with one or more conductive materials through the support pillar openings, and forming support pillars within the support pillar openings and extending vertically through the stack. The support pillars exhibit a lateral dimension in a first horizontal direction relatively larger than a lateral dimension of the slots in the first horizontal direction, substantially orthogonal to a second horizontal direction in which the slots extend.

FIG. 2 illustrates a partial cutaway perspective view of a portion of an electronic device 200 (e.g., a microelectronic device, a memory device, such as a 3D NAND Flash memory device) including one or more electronic device structures 201 (e.g., a microelectronic device structure). The electronic device 200 may be substantially similar to the electronic device 100 previously described with reference to FIGS. 1A through 1P. As shown in FIG. 2, the electronic device structure 201 of the electronic device 200 may include the staircase structure 220 within the staircase region 221 defining contact regions for connecting interconnect lines 206 to conductive structures 205 (e.g., corresponding to the conductive structures 144 (FIG. 1N)). The electronic device structure 201 may include vertical strings 207 (e.g., corresponding to the strings 170 (FIG. 1N)) of memory cells 203 (e.g., corresponding to the memory cells 172 (FIG. 1N)) that are coupled to each other in series. The vertical strings 207 may extend vertically (e.g., in the Z-direction) and orthogonally to conductive lines and the conductive structures 205, such as the data lines 202, a source tier 204 (e.g., corresponding to the source 102 (FIG. 1N)), the interconnect lines 206, first select gates 208 (e.g., upper select gates, drain select gates (SGDs)), select lines 209, and a second select gate 210 (e.g., a lower select gate, a source select gate (SGS)). The select gates 208 may be horizontally divided (e.g., in the Y-direction) into multiple blocks 232 (e.g., corresponding to the blocks 137 (FIG. 1N)) horizontally separated (e.g., in the Y-direction) from one another by slots 230 (e.g., corresponding to the slot structures 165 (FIG. 1N)) including the support pillars 164 (FIG. 1N) and the third barrier material 138 (FIG. 1N) formed within the slot region 107 (FIG. 1N).

Vertical conductive contacts 211 may electrically couple components to each other as shown. For example, the select lines 209 may be electrically coupled to the first select gates 208 and the interconnect lines 206 may be electrically coupled to the conductive structures 205. The electronic device 200 may also include a control unit 212 (e.g., corresponding to the control unit 174 (FIG. 1N)) positioned under the memory array, which may include at least one of string driver circuitry, pass gates, circuitry for selecting gates, circuitry for selecting conductive lines (e.g., the data lines 202, the interconnect lines 206), circuitry for amplifying signals, and circuitry for sensing signals. The control unit 212 may be electrically coupled to the data lines 202, the source tier 204, the interconnect lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., digit lines, bit lines) may extend horizontally in a second direction (e.g., in the Y-direction) that is at an angle (e.g., perpendicular) to the first direction in which the first select gates 208 extend. Individual data lines 202 may be coupled to individual groups of the vertical strings 207 extending the second direction (e.g., the Y-direction) at the first end (e.g., the upper end) of the vertical strings 207 of the individual groups. Additional individual groups of the vertical strings 207 extending the first direction (e.g., the X-direction) and coupled to individual first select gates 208 may share a particular vertical string 207 thereof with individual group of vertical strings 207 coupled to an individual data line 202. Thus, an individual vertical string 207 of memory cells 203 may be selected at an intersection of an individual first select gate 208 and an individual data line 202. Accordingly, the first select gates 208 may be used for selecting memory cells 203 of the vertical strings 207 of memory cells 203.

The conductive structures 205 (e.g., word lines) may extend in respective horizontal planes. The conductive structures 205 may be stacked vertically, such that each conductive structure 205 is coupled to at least some of the vertical strings 207 of memory cells 203, and the vertical strings 207 of the memory cells 203 extend vertically through the stack structure including the conductive structures 205. The conductive structures 205 may be coupled to or may form control gates of the memory cells 203.

The first select gates 208 and the second select gates 210 may operate to select a vertical string 207 of the memory cells 203 interposed between data lines 202 and the source tier 204. Thus, an individual memory cell 203 may be selected and electrically coupled to a data line 202 by operation of (e.g., by selecting) the appropriate first select gate 208, second select gate 210, and conductive structure 205 that are coupled to the particular memory cell 203.

The staircase structure 220 may be configured to provide electrical connection between the interconnect lines 206 and the conductive structures 205 through the vertical conductive contacts 211. In other words, an individual conductive structure 205 may be selected via an interconnect line 206 in electrical communication with a respective vertical conductive contact 211 in electrical communication with the conductive structure 205. The data lines 202 may be electrically coupled to the vertical strings 207 through conductive contact structures 234 (e.g., corresponding to the conductive contacts 160 (FIG. 1N)).

Accordingly, in at least some embodiments, a memory device comprises a stack structure comprising alternating conductive structures and insulative structures arranged in tiers. Each of the tiers individually comprise a conductive structure and an insulative structure including at least one air gap separating vertically neighboring conductive structures. The memory device comprises strings of memory cells extending vertically through the stack structure within memory array regions, and support pillars extending vertically through the stack structure within slot regions separating the memory array regions. The support pillars comprise a liner material laterally adjacent to the at least one air gap. The memory device comprises a barrier material within the slot regions and laterally adjacent to the support pillars.

Figure 3:
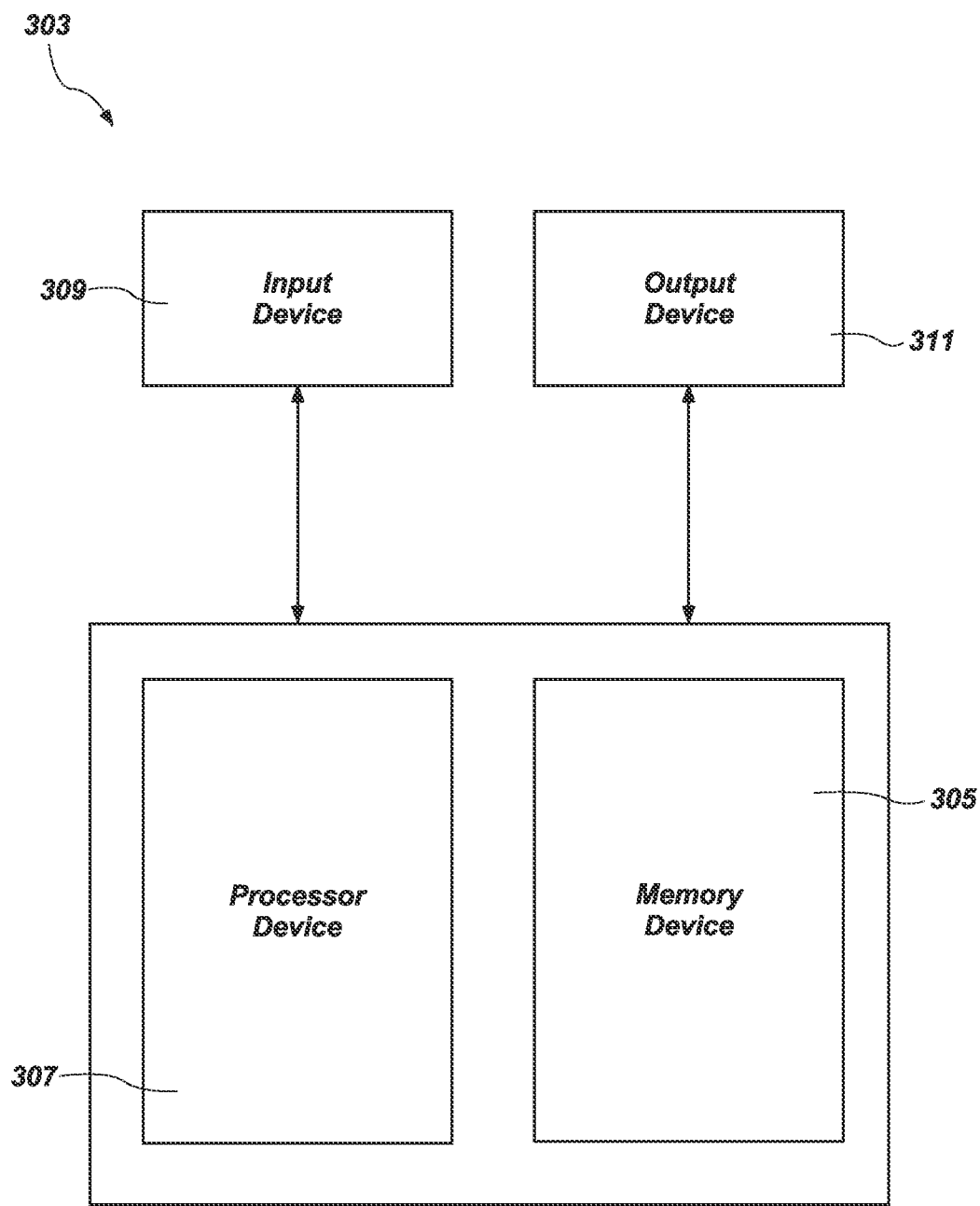
FIG. 3 is a block diagram of a system, in accordance with embodiments of the disclosure.

Electronic devices (e.g., the electronic devices 100, 200) including the support pillars 164 and the third barrier material 138 of the slot structures 165 within the slot region 107, according to embodiments of the disclosure, may be used in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of an electronic device previously described herein (e.g., the electronic devices 100, 200 previously described with reference to FIGS. 1A through 1P and FIG. 2) including the support pillars 164 and the third barrier material 138 of the slot structures 165 within the slot region 107.

The electronic system 303 may further include at least one electronic signal processor device 307 (often referred to as a "microprocessor"). The electronic signal processor device 307 may optionally include an embodiment of an electronic device previously described herein (e.g., one or more of the electronic devices 100, 200 previously described with reference to FIGS. 1A through 1P and FIG. 2). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
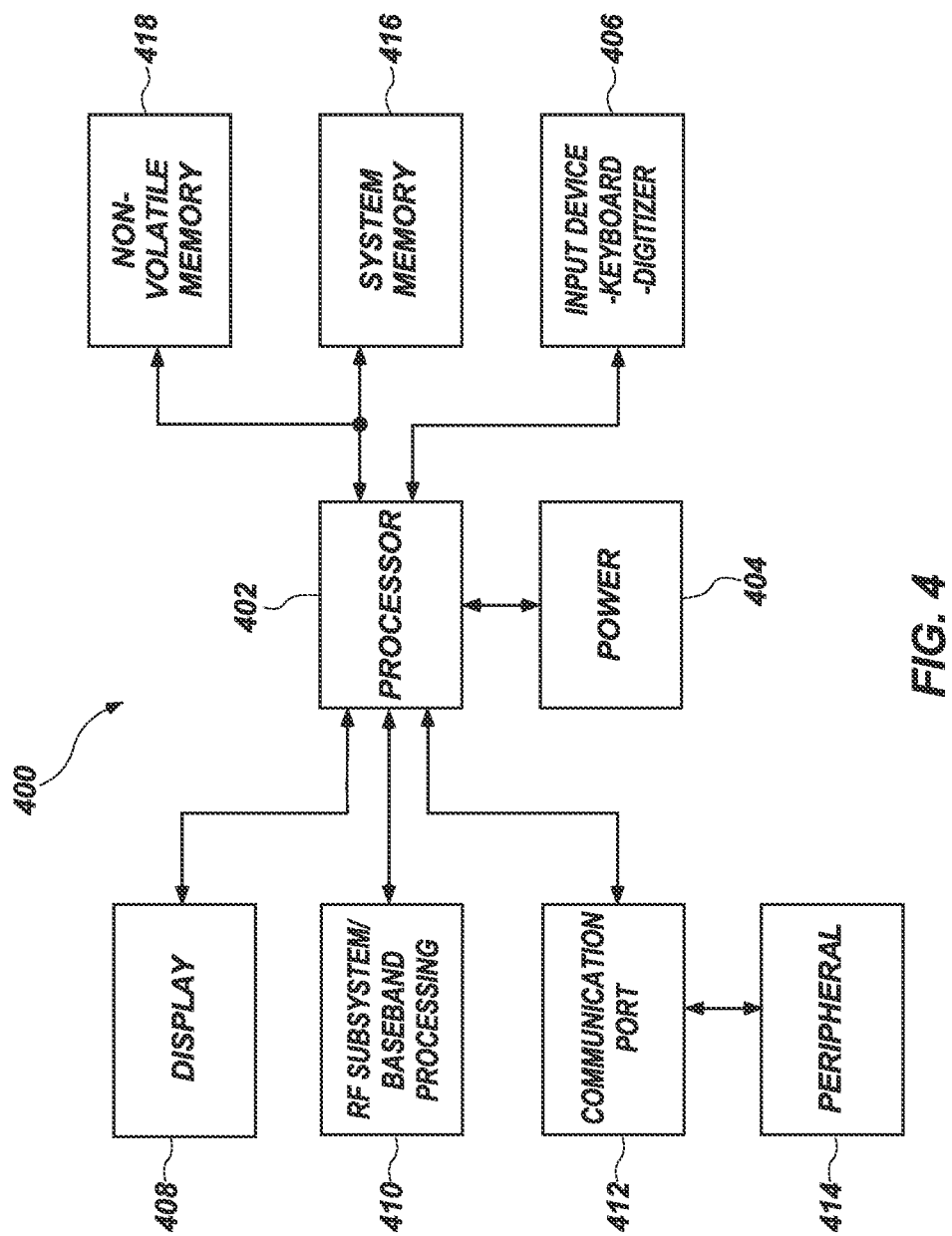
FIG. 4 is a block diagram of a processor-based system, in accordance with embodiments of the disclosure.

With reference to FIG. 4, depicted is a processor-based system 400. The processor-based system 400 may include various electronic devices (e.g., the electronic devices 100, 200) manufactured in accordance with embodiments of the present disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include electronic devices (e.g., the electronic devices 100, 200) manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the electronic devices (e.g., the electronic devices 100, 200) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include electronic devices, such as the electronic devices (e.g., the electronic devices 100, 200) described above, or a combination thereof.

Accordingly, in at least some embodiments, a system comprises a processor operably coupled to an input device and an output device, and one or more electronic devices operably coupled to the processor. The one or more electronic devices comprise strings of memory cells extending vertically through a stack comprising a vertically alternating sequence of insulative structures and conductive structures, and slot structures extending vertically through the stack and separating the stack into blocks. Each block comprises some of the strings of memory cells. The one or more electronic devices comprise support structures laterally neighboring the strings of memory cells and located within the slot structures. The support structures are in electrical communication with the strings of memory cells and circuitry underlying the stack.

The electronic devices and systems of the disclosure advantageously facilitate one or more of improved simplicity, greater packaging density, and increased miniaturization of components as compared to conventional devices and conventional systems. The methods of the disclosure facilitate the formation of devices (e.g., apparatuses, microelectronic devices, memory devices) and systems (e.g., electronic systems) having one or more of improved performance, reliability, and durability, lower costs, increased yield, increased miniaturization of components, improved pattern quality, and greater packaging density as compared to conventional devices (e.g., conventional apparatuses, conventional electronic devices, conventional memory devices) and conventional systems (e.g., conventional electronic systems).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:
a stack comprising tiers of alternating conductive levels and insulative levels overlying a source;
slots extending vertically through the stack and dividing the stack into blocks;
support pillars within the slots and extending vertically through the stack, the support pillars exhibiting a lateral dimension in a first horizontal direction relatively larger than a lateral dimension of the slots in the first horizontal direction, substantially orthogonal to a second horizontal direction in which the slots extend; and
a barrier material divided into discrete structures by the support pillars, the discrete structures of the barrier material within the slots and laterally separating the support pillars from one another in the second horizontal direction, a single line of the support pillars extending in the second horizontal direction within the slots, and the discrete structures of the barrier material extending between adjacent support pillars in the second horizontal direction.

2. The electronic device of claim 1, wherein the barrier material comprises one or more of silicon carbon nitride, polysilicon, tungsten, titanium, titanium nitride, and aluminum oxide.

3. The electronic device of claim 1, further comprising memory pillars within an array region of the electronic device and laterally adjacent to the slots, wherein the lateral dimension of the support pillars in the first horizontal direction is relatively larger than a lateral dimension of the memory pillars in the first horizontal direction.

4. The electronic device of claim 1, further comprising a carbon-containing material between the source and the stack, the support pillars extending through the carbon-containing material and contacting the source.

5. The electronic device of claim 1, wherein the insulative levels comprise air gaps vertically separating conductive structures of the conductive levels from one another, the insulative levels being substantially devoid of an oxide material within horizontal boundaries of the conductive structures.

6. The electronic device of claim 5, wherein the support pillars comprise a conductive material substantially surrounded by an insulative liner material, the air gaps partially defined by sidewalls of the insulative liner material of the support pillars.

7. A memory device, comprising:
a stack structure comprising alternating conductive structures and insulative structures arranged in tiers, each of the tiers individually comprising a conductive structure and an insulative structure including at least one air gap separating vertically neighboring conductive structures;
strings of memory cells extending vertically through the stack structure within memory array regions of the memory device;
support pillars extending vertically through the stack structure within slot regions separating the memory array regions, the support pillars comprising a liner material laterally adjacent to the at least one air gap; and
a barrier material within the slot regions and laterally adjacent to the support pillars, the barrier material divided into discrete structures by the support pillars.

8. The memory device of claim 7, further comprising conductive contacts and a CMOS under array (CUA) region under the memory array regions, wherein the conductive contacts connect the support pillars to circuitry of the CUA region.

9. The memory device of claim 7, further comprising an etch stop material underlying the barrier material within the slot regions.

10. The memory device of claim 7, wherein the support pillars individually exhibit a substantially circular cross-sectional shape, the support pillars laterally separated from one another by the barrier material along a vertical height of the support pillars.

11. The memory device of claim 7, further comprising a carbon-containing material overlying the stack structure, wherein upper surfaces of the carbon-containing material, the barrier material, and the support pillars are substantially coplanar with one another, and wherein the support pillars extend to a lower depth than a depth to which the barrier material extends.

12. A method of forming an electronic device, the method comprising:
forming pillars in a stack comprising alternating first materials and second materials within an array region, the stack overlying a source;
forming slots extending vertically through the stack and dividing the stack into blocks;
forming a barrier material within the slots;
forming support pillar openings through the barrier material;
replacing the first materials of the stack with one or more conductive materials through the support pillar openings to form tiers of the stack comprising alternating conductive materials and the second materials; and
forming support pillars within the support pillar openings and extending vertically through the stack, the support pillars exhibiting a lateral dimension in a first horizontal direction relatively larger than a lateral dimension of the slots in the first horizontal direction, substantially orthogonal to a second horizontal direction in which the slots extend, a single line of the support pillars extending in the second horizontal direction within the slots, the barrier material divided into discrete structures by the support pillars, the discrete structures of the barrier material laterally separating the support pillars from one another in the second horizontal direction, and the discrete structures of the barrier material extending between adjacent support pillars in the second horizontal direction.

13. The method of claim 12, wherein forming the pillars in the stack comprises:
forming a sacrificial material in openings extending vertically through a first deck;
forming a second deck over the first deck;
forming extended openings extending vertically through the first deck and the second deck; and
forming the pillars in the extended openings.

14. The method of claim 12, wherein forming the slots comprises forming additional sacrificial material in a lower portion of the slots prior to forming the pillars and forming extended slots extending vertically through an entirety of the stack following formation of the pillars.

15. The method of claim 1, further comprising:
removing the second materials of the stack to form openings extending between vertically neighboring conductive structures; and
forming a liner material within the slots to form air gaps within the openings, lateral side boundaries of the air gaps substantially vertically aligned with lateral side surfaces of at least some of the conductive structures.

16. The method of claim 12, wherein forming the support pillars comprises electrically connecting a conductive material of the support pillars to conductive structures underlying the stack.

17. The method of claim 12, further comprising forming an additional barrier material over the source prior to forming the stack, a material composition of the additional barrier material substantially the same as a material composition of the barrier material within the slots.

18. The method of claim 12, further comprising forming additional discrete structures of the barrier material in additional support pillar openings within the array region during formation of the barrier material within the slots.

19. A system, comprising:
a processor operably coupled to an input device and an output device; and
one or more electronic devices operably coupled to the processor, the one or more electronic devices comprising:
strings of memory cells extending vertically through a stack comprising a vertically alternating sequence of insulative structures and conductive structures;
slot structures extending vertically through the stack and separating the stack into blocks, each block comprising some of the strings of memory cells;
support structures laterally neighboring the strings of memory cells and located within the slot structures, the support structures in electrical communication with the strings of memory cells and circuitry underlying the stack; and
a barrier material within the slots and laterally separating the support structures from one another, the barrier material divided into discrete structures by the support structures.

\* \* \* \* \*

UNITED STATES PATENT AND TRADEMARK OFFICE
CERTIFICATE OF CORRECTION

PATENT NO. : 12,394,481 B2
APPLICATION NO. : 17/668304
DATED : August 19, 2025
INVENTOR(S) : Darwin A. Clampitt, John D. Hopkins and Roger W. Lindsay Page 1 of 1

It is certified that error appears in the above-identified patent and that said Letters Patent is hereby corrected as shown below:

In the Specification

| | | |
|---|---|---|
| Column 2, | Line 1, | change "(FIGS. 1, 1F, 1J," to --(FIGS. 1B, 1F, 1J,-- |
| Column 13, | Line 65, | change "(See FIG. 1)." to --(See FIG. 1B).-- |
| Column 21, | Line 48, | change "FIGS. 1I and 1J," to --FIGS. 1I and 1J,-- |

In the Claims

| | | | |
|---|---|---|---|
| Claim 15, | Column 45, | Line 1, | change "of claim 1, further" to --of claim 12, further-- |

Signed and Sealed this
Twenty-first Day of October, 2025

John A. Squires
*Director of the United States Patent and Trademark Office*